(12) United States Patent
Loechelt et al.

(10) Patent No.: US 8,530,299 B2
(45) Date of Patent: Sep. 10, 2013

(54) ELECTRONIC DEVICE INCLUDING A WELL REGION

(75) Inventors: Gary H. Loechelt, Tempe, AZ (US); Gordon M. Grivna, Mesa, AZ (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 0 days.

(21) Appl. No.: 13/353,223

(22) Filed: Jan. 18, 2012

(65) Prior Publication Data

US 2012/0112278 A1 May 10, 2012

Related U.S. Application Data

(62) Division of application No. 12/495,278, filed on Jun. 30, 2009, now Pat. No. 8,124,468.

(51) Int. Cl.
*H01L 21/8238* (2006.01)

(52) U.S. Cl.
USPC ........... 438/202; 438/218; 438/219; 438/294; 438/353; 438/400; 257/500; 257/501; 257/502; 257/520

(58) Field of Classification Search
USPC ................. 257/500–502, 520; 438/218–219, 438/202, 294, 353, 400
See application file for complete search history.

(56) References Cited

U.S. PATENT DOCUMENTS

| | | | | |
|---|---|---|---|---|
| 4,258,379 A | * | 3/1981 | Watanabe et al. | 257/574 |
| 4,285,116 A | * | 8/1981 | Meguro | 438/227 |
| 4,599,635 A | * | 7/1986 | Itoh et al. | 257/574 |
| 4,661,838 A | * | 4/1987 | Wildi et al. | 257/336 |
| 4,763,181 A | * | 8/1988 | Tasch, Jr. | 257/300 |
| 4,862,240 A | * | 8/1989 | Watanabe et al. | 257/370 |
| 4,881,107 A | * | 11/1989 | Matsushita | 257/338 |
| 4,901,129 A | * | 2/1990 | Hynecek | 257/223 |
| 4,918,502 A | * | 4/1990 | Kaga et al. | 257/304 |
| 4,992,841 A | * | 2/1991 | Halvis | 257/221 |
| 5,060,044 A | * | 10/1991 | Tomassetti | 257/370 |
| 5,070,381 A | * | 12/1991 | Scott et al. | 257/558 |
| 5,157,544 A | * | 10/1992 | Nitta | 359/344 |

(Continued)

FOREIGN PATENT DOCUMENTS

WO 2007/118060 A2 10/2007

OTHER PUBLICATIONS

Gary H. Loechelt et al., U.S. Appl. No. 12/495,278, Final Office Action, Jul. 25, 2011, 11 pgs.

(Continued)

*Primary Examiner* — Fernando L Toledo
*Assistant Examiner* — Mohammed Shamsuzzaman
(74) *Attorney, Agent, or Firm* — George R. Meyer

(57) ABSTRACT

An electronic device including an integrated circuit can include a buried conductive region and a semiconductor layer overlying the buried conductive region, and a vertical conductive structure extending through the semiconductor layer and electrically connected to the buried conductive region. The integrated circuit can further include a doped structure having an opposite conductivity type as compared to the buried conductive region, lying closer to an opposing surface than to a primary surface of the semiconductor layer, and being electrically connected to the buried conductive region. The integrated circuit can also include a well region that includes a portion of the semiconductor layer, wherein the portion overlies the doped structure and has a lower dopant concentration as compared to the doped structure. In other embodiment, the doped structure can be spaced apart from the buried conductive region.

16 Claims, 12 Drawing Sheets

(56) References Cited

U.S. PATENT DOCUMENTS

| | | | |
|---|---|---|---|
| RE34,158 E * | 1/1993 | Watanabe et al. | 257/42 |
| 5,182,469 A * | 1/1993 | Farley et al. | 327/534 |
| 5,204,277 A * | 4/1993 | Somero et al. | 438/366 |
| 5,218,228 A * | 6/1993 | Williams et al. | 257/593 |
| 5,225,365 A * | 7/1993 | Cosentino | 438/208 |
| 5,278,084 A * | 1/1994 | Lee et al. | 438/207 |
| 5,290,714 A * | 3/1994 | Onozawa | 438/207 |
| 5,559,044 A | 9/1996 | Williams et al. | |
| 5,939,755 A * | 8/1999 | Takeuchi et al. | 257/347 |
| 6,518,138 B2 | 2/2003 | Hsing | |
| 6,764,940 B1 | 7/2004 | Rozbicki et al. | |
| 6,890,804 B1 | 5/2005 | Shibib et al. | |
| 6,949,432 B2 * | 9/2005 | Blanchard | 438/259 |
| 7,256,119 B2 * | 8/2007 | Grivna et al. | 438/620 |
| 7,276,747 B2 | 10/2007 | Loechelt et al. | |
| 7,391,080 B2 | 6/2008 | Arnborg et al. | |
| 7,420,258 B2 * | 9/2008 | Grivna et al. | 257/505 |
| 7,439,583 B2 | 10/2008 | Hshieh | |
| 7,446,375 B2 | 11/2008 | Xu et al. | |
| 2004/0099878 A1 * | 5/2004 | Huang et al. | 257/170 |
| 2007/0278516 A1 | 12/2007 | Hashiomoto et al. | |
| 2008/0122025 A1 * | 5/2008 | Roggenbauer et al. | 257/501 |
| 2008/0197411 A1 | 8/2008 | Korec et al. | |
| 2008/0242029 A1 | 10/2008 | Wu et al. | |
| 2008/0246086 A1 | 10/2008 | Korec et al. | |
| 2012/0248548 A1 * | 10/2012 | Loechelt et al. | 257/392 |

OTHER PUBLICATIONS

T. Hasiomoto et al., "System in Package with Mounted Capacitor for Reduced Parasitic Inductance in Voltage Regulators", 2008, IEEE.

Wayne Burger et al., "RF-LDMOS: A Device Technology for High Power RF Infrastructure Application", IEEE CSIC Digest, 2004.

Peter Hazucha, et al., "A 233-MHz 80%-87% Efficient Four-Phase DC-DC Converter Utilizing Air Code Inductors on Package", IEEE Journal of Solid State Circuits, vol. 40, No. 4, Apr. 2005.

Gary H. Loechelt, U.S. Appl. No. 12/337,234, filed Dec. 17, 2008.

Gary H. Loechelt, U.S. Appl. No. 12/337,271, filed Dec. 17, 2008.

Gary H. Loechelt, U.S. Appl. No. 12/337,306, filed Dec. 17, 2008.

Gerhard Schrom et al., "A 480-MHZ, Multi-Phase Interleaved Buck DC-DC Converter with Hysteretic Control", Circuit Research, Intel Labs, Hillsboro, OR, USA, IEEE, 2004.

Adriaan W. Ludikhuize "Self-aligned and Shielded-Resurf LDMOS for defense 20V Power IC's". The 11th International Symposium on Power Semiconductor Devices and ICs, (ISPSD99), Toronto, Canada, May 26-28, 1999.

* cited by examiner

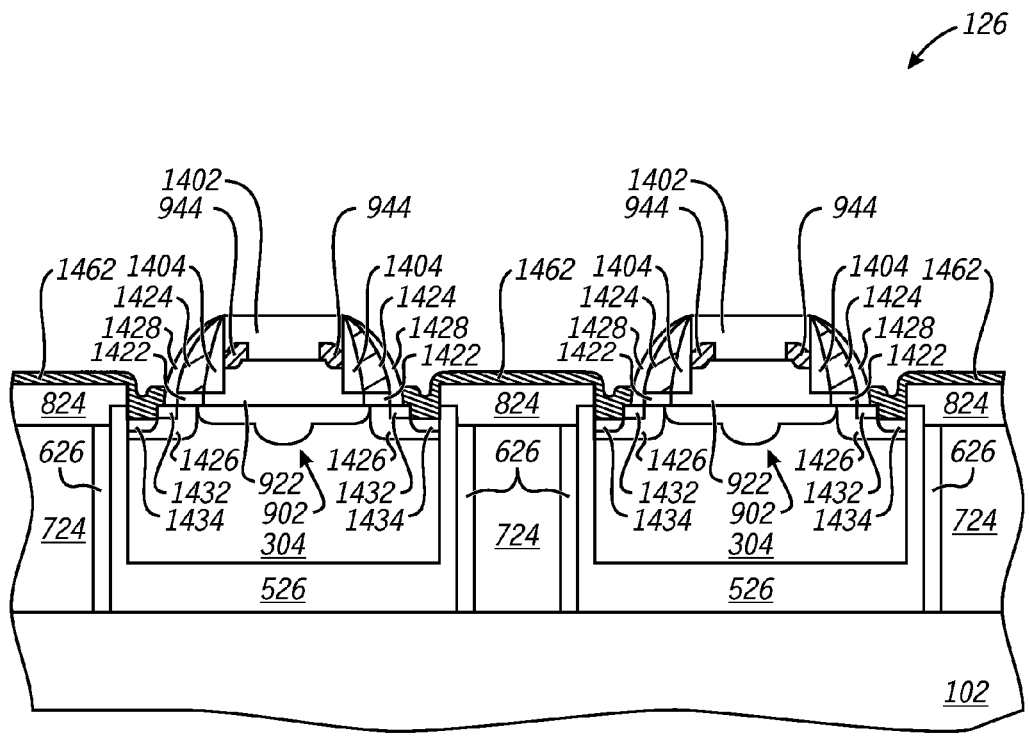
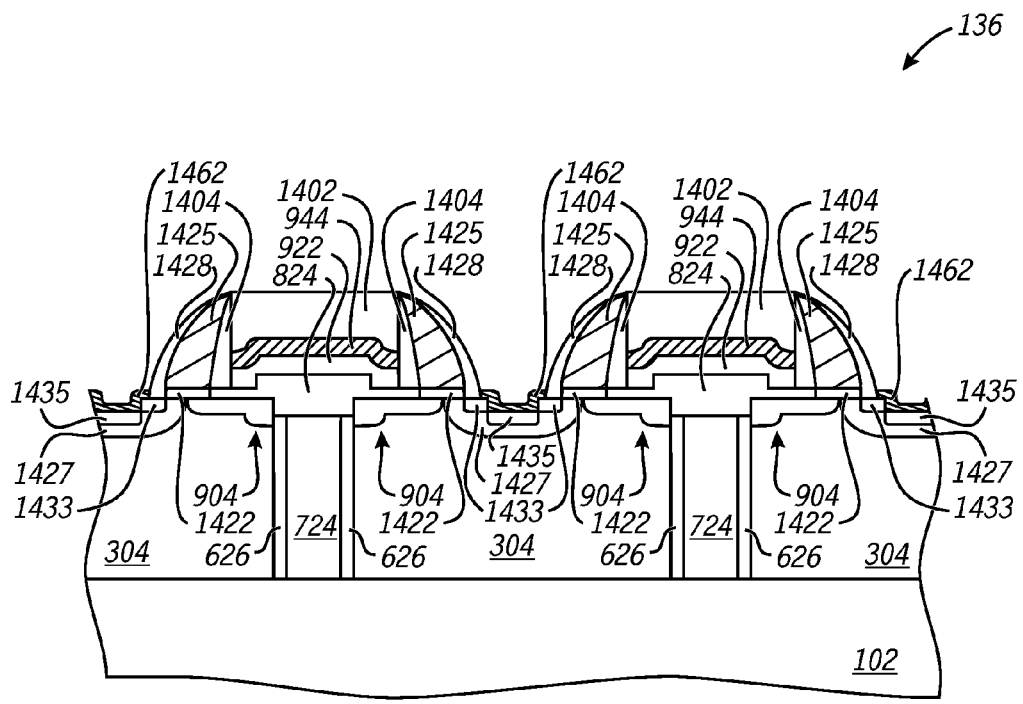
FIG. 10

ELECTRONIC DEVICE INCLUDING A WELL REGION

CROSS-REFERENCE TO RELATED APPLICATION

This is a divisional of and claims priority under 35 U.S.C. §120 to U.S. patent application Ser. No. 12/495,278 entitled "Electronic Device Including a Well Region" by Loechelt et al. on Jun. 30, 2009, which is assigned to the current assignee hereof and incorporated herein by reference in its entirety.

FIELD OF THE DISCLOSURE

The present disclosure relates to electronic devices and processes of forming electronic devices, and more particularly to, electronic devices including insolated well regions and processes of forming the same.

RELATED ART

Metal-oxide semiconductor field effect transistors (MOSFETs) are a common type of power switching device. A MOSFET includes a source region, a drain region, a channel region extending between the source and drain regions, and a gate structure provided adjacent to the channel region. The gate structure includes a gate electrode layer disposed adjacent to and separated from the channel region by a thin dielectric layer.

When a MOSFET is in the on state, a voltage is applied to the gate structure to form a conduction channel region between the source and drain regions, which allows current to flow through the device. In the off state, any voltage applied to the gate structure is sufficiently low so that a conduction channel does not form, and thus current flow does not occur. During the off state, the device must support a high voltage between the source and drain regions.

In a particular application, a pair of power transistors can be used to allow an output to switch between two different voltages. The output can be connected to a source of a high-side power transistor and to a drain of a low-side power transistor. When the high-side power transistor is activated, the output will be at a voltage corresponding to the voltage on a drain of the high-side power transistor, and when the low-side power transistor is activated, the output will be at a voltage corresponding to a source of the low-side power transistor. In a particular physical embodiment, the high-side power transistor and the low-side power transistor are typically discrete transistors on separate dies that are interconnected to each other by bonded wire or other similar interconnects. Further, the control circuitry for both power transistors are on still another separate die. The interconnects increase the parasitic characteristics of the electronic device, including the high-side and low-side power transistors, which are undesired.

BRIEF DESCRIPTION OF THE DRAWINGS

Embodiments are illustrated by way of example and are not limited in the accompanying figures.

FIG. 10 includes illustrations of cross-sectional views of portions of the workpiece of FIG. 9 after forming a high-side power transistor and a low-side power transistor.

Figure 1:
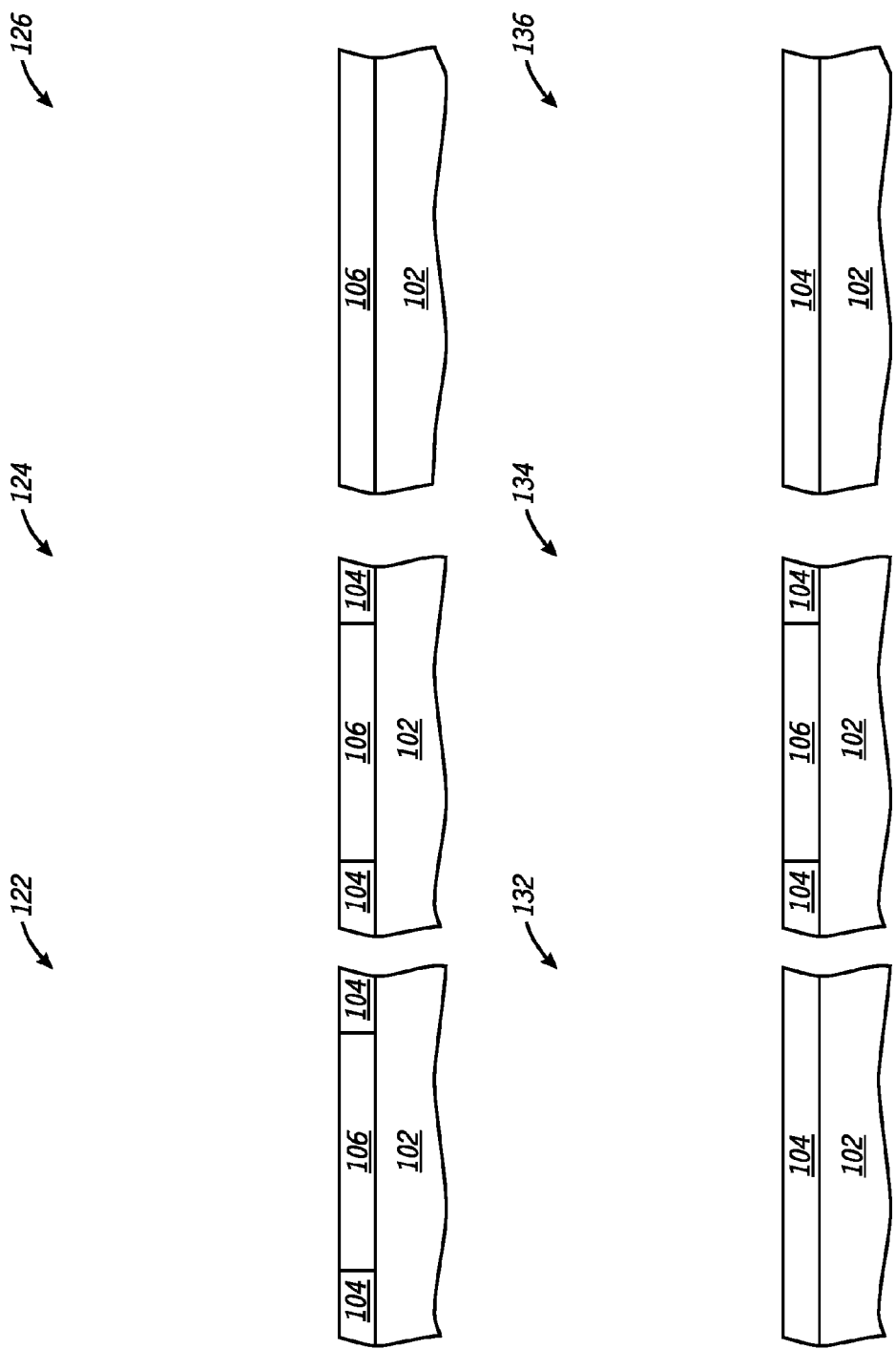
FIG. 1 includes illustrations of cross-sectional views of portions of a workpiece that includes a buried conductive region, a semiconductor layer, and a buried doped region.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other teachings can certainly be utilized in this application.

As used herein, the terms "horizontally-oriented" and "vertically-oriented," with respect to a region or structure, refers to the principal direction in which current flows through such region or structure. More specifically, current can flow through a region or structure in a vertical direction, a horizontal direction, or a combination of vertical and horizontal directions. If current flows through a region or structure in a vertical direction or in a combination of directions, wherein the vertical component is greater than the horizontal component, such a region or structure will be referred to as vertically oriented. Similarly, if current flows through a region or structure in a horizontal direction or in a combination of directions, wherein the horizontal component is greater than the vertical component, such a region or structure will be referred to as horizontally oriented.

The term "normal operation" and "normal operating state" refer to conditions under which an electronic component or device is designed to operate. The conditions may be obtained from a data sheet or other information regarding voltages, currents, capacitance, resistance, or other electrical parameters. Thus, normal operation does not include operating an electrical component or device well beyond its design limits.

The terms "comprises," "comprising," "includes," "including," "has," "having" or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one or at least one and the singular also includes the plural, or vice versa, unless it is clear that it is meant otherwise. For example, when a single item is described herein, more than one item may be used in place of a single item. Similarly, where more than one item is described herein, a single item may be substituted for that more than one item.

Group numbers corresponding to columns within the Periodic Table of the elements use the "New Notation" convention as seen in the *CRC Handbook of Chemistry and Physics*, 81$^{st}$ Edition (2000-2001).

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the semiconductor and electronic arts.

In FIGS. 1 to 9, six different sections of a workpiece are illustrated to improve understanding of the effect of processing operations when forming different types of electronic components on the same workpiece. The electronic components can be part of the same integrated circuit. The illustrations closer to the top of the figures correspond to a high-side power transistor and electronic components potentially coupled to or otherwise associated with the high-side power transistor, and the illustrated closer to the bottom of the same figures correspond to a low-side power transistor and electronic components potentially coupled to or otherwise associated with the low-side power transistor.

FIG. 1 includes an illustration of a cross-sectional view of a portion of a workpiece 100. Many different sections of the integrated circuit are illustrated in FIG. 1. More particularly, section 122 includes a portion of the integrated circuit where a p-well region that will be electrically connected to the buried conductive region 102 will be formed, section 124 includes another portion of the integrated circuit where an n-well region will be formed, and section 126 includes yet another portion of the integrated circuit where a high-side power transistor will be formed. Section 132 includes a portion of the integrated circuit where a p-well region will be formed, section 134 includes another portion of the integrated circuit where another n-well region will be formed, and section 136 includes yet another portion of the integrated circuit where a low-side power transistor will be formed.

In a particular embodiment, electronic components in support of or used in conjunction with the high-side transistor in section 126 can be formed within sections 122 and 124, and electronic components in support of or used in conjunction with the low-side transistor in section 136 can be formed within sections 132 and 134.

In FIG. 1, the workpiece 100 includes a buried conductive region 102. The buried conductive region 102 can include a Group 14 element (i.e., carbon, silicon, germanium, or any combination thereof) and can be heavily n-type or p-type doped. For the purposes of this specification, heavily doped is intended to mean a peak dopant concentration of at least $10^{19}$ atoms/cm$^3$, and lightly doped is intended to mean a peak dopant concentration of less than $10^{19}$ atoms/cm$^3$. The buried conductive region 102 can be a portion of a heavily doped substrate (e.g., a heavily n-type doped wafer) or may be a buried doped region overlying a substrate of opposite conductivity type or overlying a buried insulating layer (not illustrated) that lies between a substrate and the buried doped region. In an embodiment, the buried conductive region 102 is heavily doped with an n-type dopant, such as phosphorus, arsenic, antimony, or any combination thereof. In a particular embodiment, the buried conductive region 102 includes arsenic or antimony if diffusion of the buried conductive region 102 is to be kept low, and in a particular embodiment, the buried conductive region 102 includes antimony to reduce the level of autodoping (as compared to arsenic) during formation of a subsequently-formed semiconductor layer. The buried conductive region 102 will be used to electrically connect the source of the high-side power transistor and the drain of the low-side power transistor together and be part of an output node for the electronic device. Thus, the buried conductive region 102 varies depending on the control signals to the control electrodes of the high-side and low-side power transistors, and therefore, the voltage on the buried conductive region 102 is not substantially constant and may vary with time or another parameter.

A semiconductor layer 104 is formed over the buried conductive region 102. The semiconductor layer 104 can include a Group 14 element (i.e., carbon, silicon, germanium, or any combination thereof) and any of the dopants as described with respect to the buried conductive region 102 or dopants of the opposite conductivity type. In an embodiment, the semiconductor layer 104 is a lightly doped n-type or p-type epitaxial silicon layer having a thickness in a range of approximately 0.2 microns to approximately 1.0 micron, and a doping concentration no greater than approximately $10^{17}$ atoms/cm$^3$, and in another embodiment, a doping concentration of at least approximately $10^{14}$ atoms/cm$^3$. The semiconductor layer 104 is formed over all of the workpiece 100.

Portions of the semiconductor layer 104 within the high-side power transistor and within sections 122, 124, and 134 are heavily doped with dopant of opposite conductivity type as compared to the buried conductive region 102 to form buried doped regions 106. The buried doped regions 106 can help with isolation within the high-side power transistor and reduce parasitic characteristics within the high-side power transistor and many of the electronic components within other parts of the integrated circuits. In a particular embodiment, the buried doped regions 106 have a peak dopant concentration of at least approximately $10^{19}$ atoms/cm$^3$ of a p-type dopant. The buried doped regions 106 within the sections 122, 124, 126, and 134 can be the horizontal portions of doped structures being formed.

Figure 2:
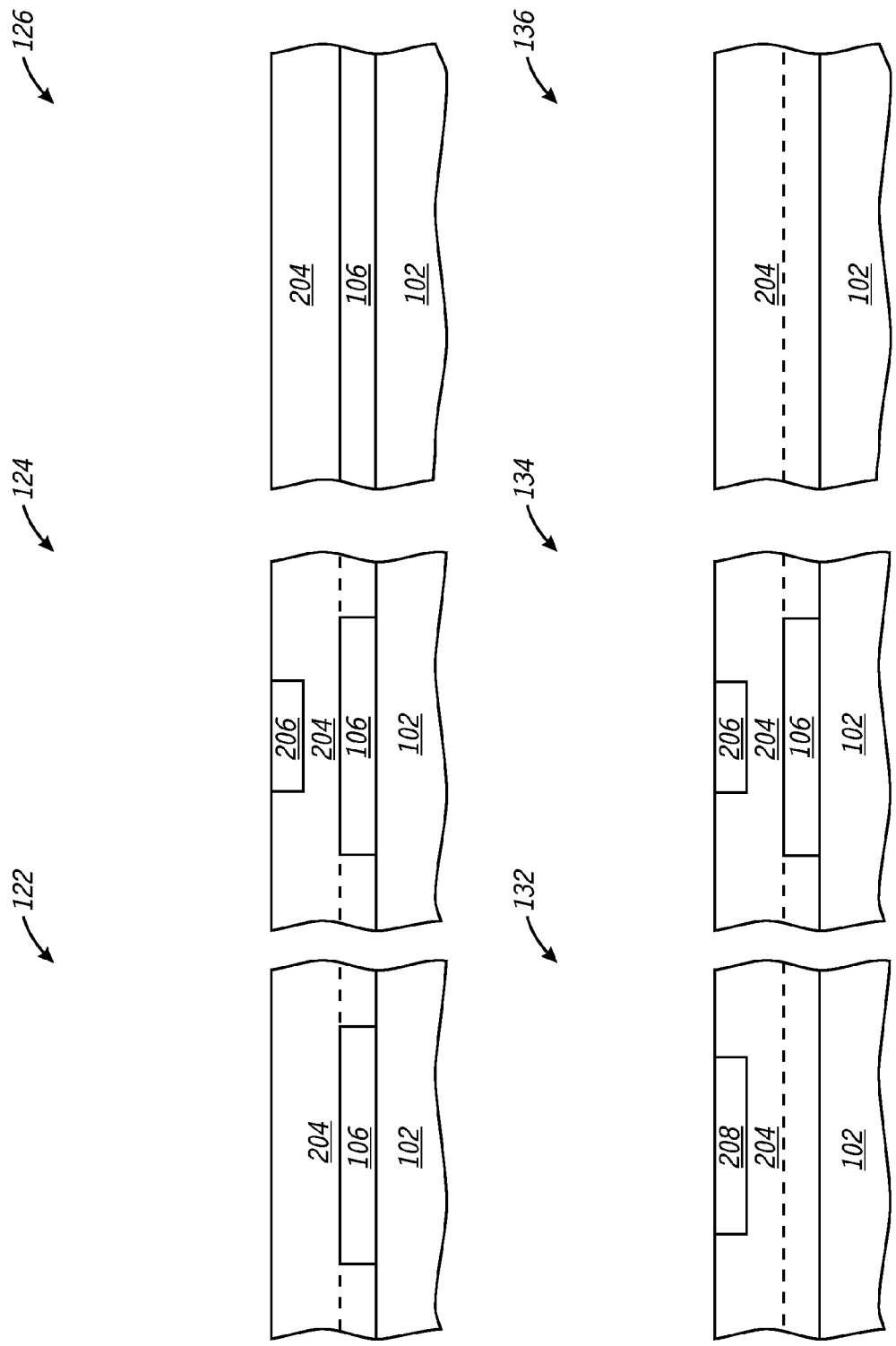
FIG. 2 includes illustrations of cross-sectional views of portions of the workpiece of FIG. 1 after forming another semiconductor layer and other buried doped regions.

Referring to FIG. 2, a semiconductor layer 204 is formed over the semiconductor layer 104 (not labeled in FIG. 2) and the buried doped regions 106. In a particular embodiment, the semiconductor layers 104 and 204 have the same conductivity type and both may be lightly doped. Thus, the dashed line within the illustration of FIG. 2 illustrates an approximate location where the semiconductor layer 104 ends and the semiconductor layer 204 starts. The semiconductor layer 204 can include a Group 14 element (i.e., carbon, silicon, germanium, or any combination thereof) and any of the dopants as described with respect to the buried conductive region 102 or dopants of the opposite conductivity type. In an embodiment, the semiconductor layer 204 is a lightly doped n-type or p-type epitaxial silicon layer having a thickness in a range of approximately 0.5 microns to approximately 5.0 microns, and a doping concentration no greater than approximately $10^{17}$ atoms/cm$^3$, and in another embodiment, a doping concentration of at least approximately $10^{14}$ atoms/cm$^3$.

Portions of the semiconductor layer 204 within sections 124 and 134 are heavily doped with an n-type dopant to form other buried doped regions 206. The buried doped regions 206 are optional and may help to further isolate the n-well regions that are being formed. In a particular embodiment, the buried doped regions 206 have a peak dopant concentration of at least approximately $10^{19}$ atoms/cm$^3$ of an n-type dopant. A portion of the semiconductor layer 204 within section 132 is heavily doped with a p-type dopant to form yet another buried doped region 208. In a particular embodiment, the buried doped region 208 has a peak dopant concentration of at least approximately $10^{19}$ atoms/cm$^3$ of a p-type dopant. The buried doped regions 206 and 208 within the sections 124, 132, and 134 are the horizontal portions of doped structures being formed.

Figure 3:
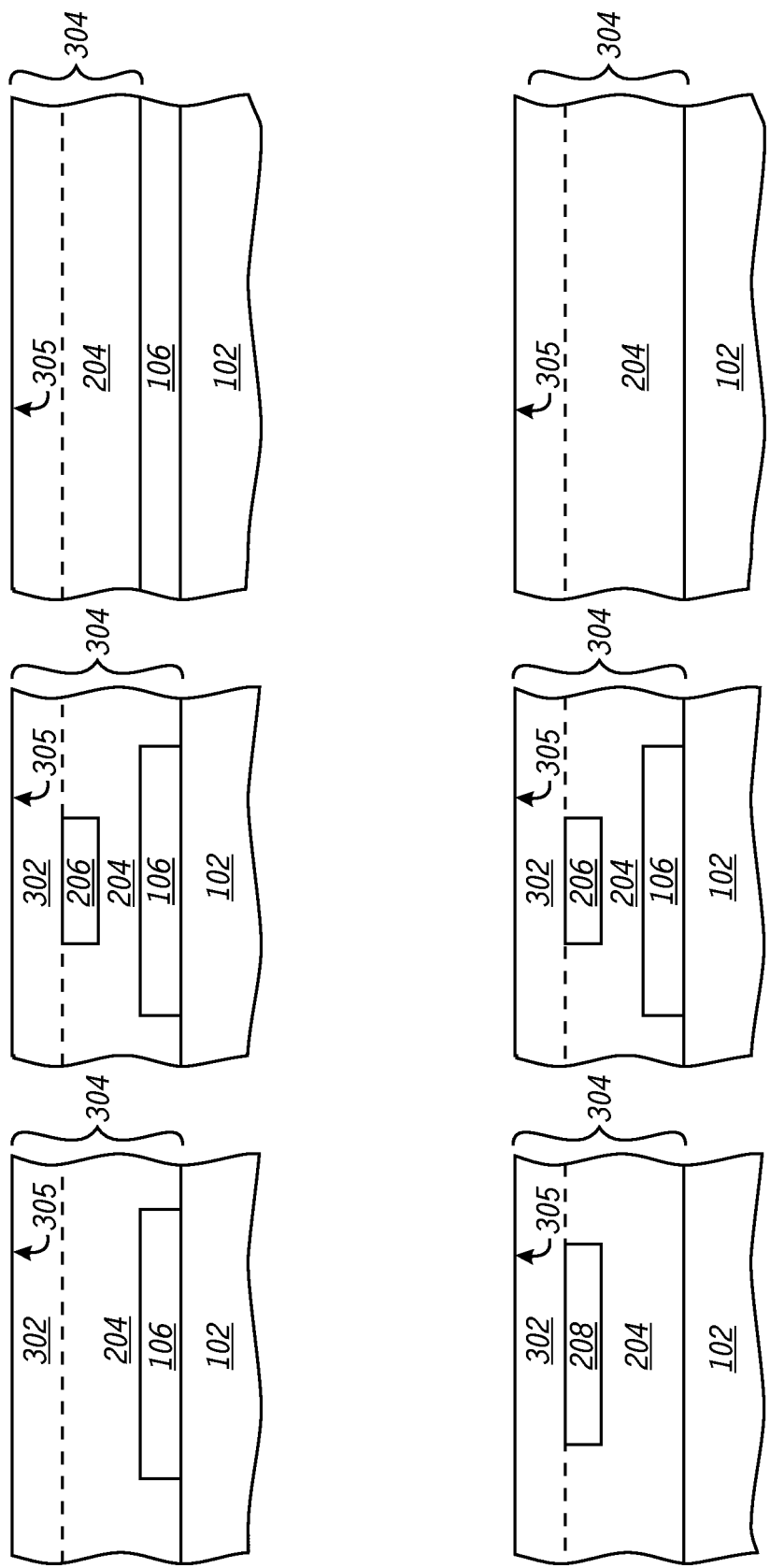
FIG. 3 includes illustrations of cross-sectional views of portions of the workpiece of FIG. 2 after forming yet another semiconductor layer to complete formation of a composite semiconductor layer.

Referring to FIG. 3, a semiconductor layer 302 is formed over the semiconductor layer 204 and the buried doped regions 206 and 208. The combination of the semiconductor layers 104 (not labeled in FIG. 3), 204, and 302 form a composite semiconductor layer 304. In a particular embodiment, the semiconductor layers 104, 204 and 302 have the same conductivity type and may be lightly doped. Thus, the dashed lines in FIG. 3 illustrate approximate locations where the semiconductor layer 204 ends and the semiconductor layer 302 starts. The semiconductor layer 302 can include a Group 14 element (i.e., carbon, silicon, germanium, or any combination thereof) and any of the dopants as described with respect to the buried conductive region 102 or dopants of the opposite conductivity type. In an embodiment, the semiconductor layer 302 is a lightly doped n-type or p-type epitaxial silicon layer having a thickness in a range of approximately 0.5 microns to approximately 5.0 microns, and a doping concentration no greater than approximately $10^{17}$ atoms/cm$^3$, and in another embodiment, a doping concentration of at least approximately $10^{14}$ atoms/cm$^3$.

The composite semiconductor layer 304 has a primary surface 305. The dopant concentration within the composite semiconductor layer 304 outside the buried doped regions 106, 206, and 208 and before any further selectively doping of regions within the semiconductor layer 304 will be referred to as the background dopant concentration. In subsequent illustrations of the combination of the semiconductor layers 104, 204, and 302 will be referred to as the semiconductor layer 304 and will not include dashed lines between the individual layers that make up the composite semiconductor layer 304. In one embodiment, the buried doped regions 206 and 208 lie at elevations halfway between the primary surface of the semiconductor layer 304 and either or both of the buried conductive region 102 or the buried doped regions 106. In another embodiment, the buried doped regions 106 are spaced apart from the primary surface 305, and lie closer to a surface of the semiconductor layer 304 that is opposite to the primary surface 305, than to the primary surface 305.

Figure 4:
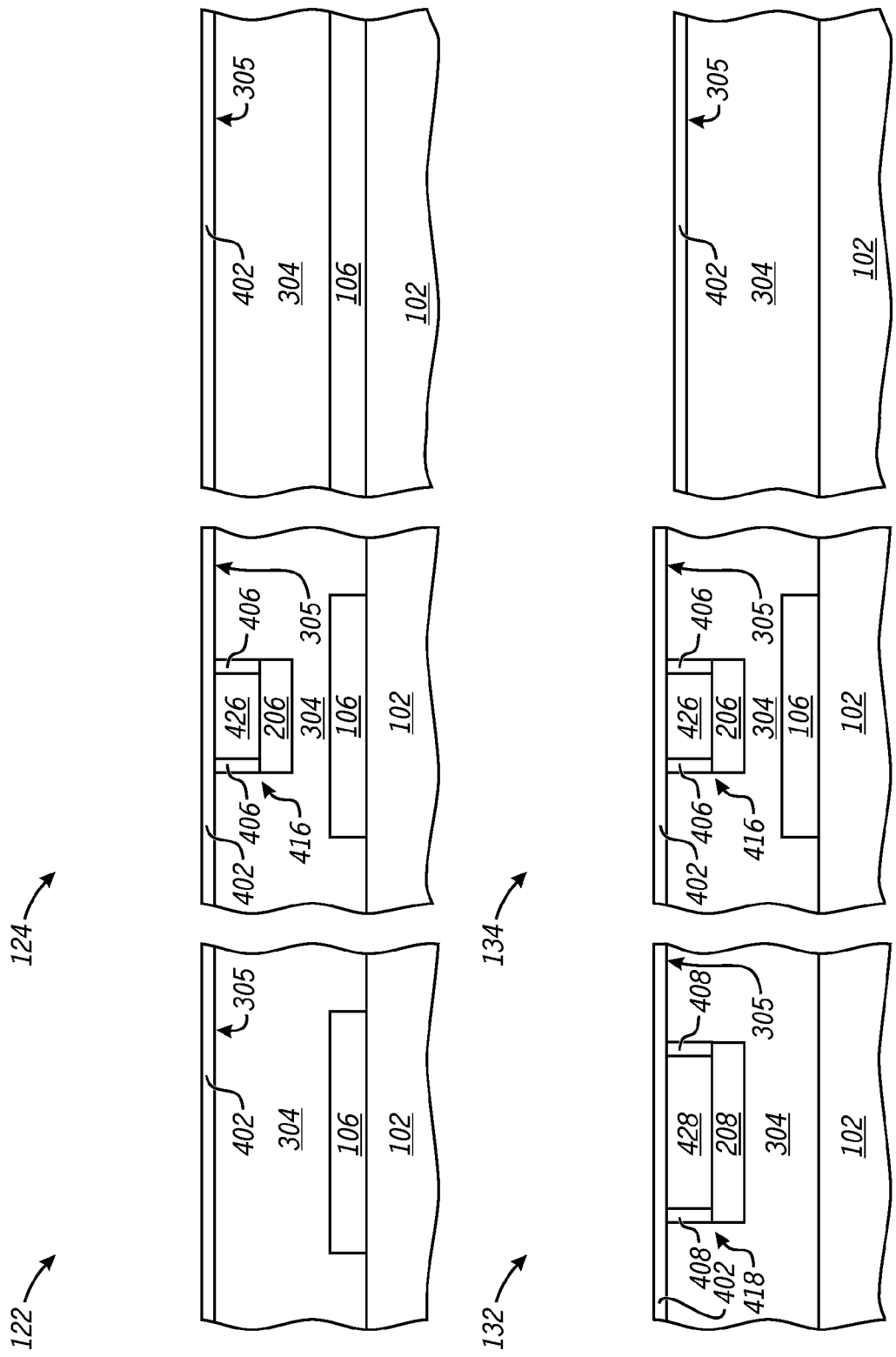
FIG. 4 includes illustrations of cross-sectional views of portions of the workpiece of FIG. 3 after forming an implant screen layer and vertical doped portions within the semiconductor layer.

An implant screen layer 402 can be formed over the primary surface 305, as illustrated in FIG. 4. The implant screen layer 402 can include an oxide, a nitride, or an oxynitride and may have a thickness in a range of approximately 2 nm to approximately 50 nm. The implant screen layer 402 can be formed by a thermal growth or deposition technique.

A masking layer (not illustrated) is formed over the implant screen layer 402 and patterned to define openings only where vertical portions 406 of doped structures 416 are being formed. Portions of the semiconductor layer 304 within sections 124 and 134 are heavily doped with an n-type dopant to form the vertical portions 406 of the doped structures 416. In a particular embodiment, the vertical portions 406 have a peak dopant concentration of at least approximately $10^{19}$ atoms/cm$^3$ of an n-type dopant. The masking layer is removed, and another masking layer (not illustrated) is formed over the implant screen layer 402 and patterned to define openings only where vertical portions 408 of doped structures 418 are being formed. Portions of the semiconductor layer 304 within section 132 are heavily doped with a p-type dopant to form vertical portions 408 of the doped structure 418. In a particular embodiment, the vertical portions 408 have a peak dopant concentration of at least approximately $10^{19}$ atoms/cm$^3$ of a p-type dopant. The other masking layer is then removed.

The doped structures 416 include the vertical portions 406 and horizontal portions (i.e., buried doped regions 206), and the doped structure 418 includes the vertical portions 408 and a horizontal portion (i.e., buried doped region 208). The doped structures 416 and 418 are in the shape of tub (as would be seen in a three-dimensional depiction (not illustrated)), and, in the cross-sectional view illustrated in FIG. 4, are U-shaped. The doped structures 416 and 418 define interior portions 426 and 428, respectively, of the semiconductor layer 304. The interior portions 426 and 428 have a lower dopant concentration as compared to the doped structures 416 and 418. The interior portions 426 and 428 can have the same or different conductivity types, dopants, and concentrations as compared to the one another and the semiconductor layer 304 at regions spaced apart from the doped structures 416 and 418 and buried regions 106. Well regions can include combinations of the doped structures 416 and the interior portions 426 and a combination of the doped structure 418 and the interior portion 428. Electronic components that are designed to operate at voltages lower than the low-side and high-side power transistors can be formed within the well regions and normally operate without significant interference or other adverse affects from the low-side and high-side power transistors. In subsequent figures, the doped structures 416 and 418 will be illustrated without the separate horizontal and vertical portions thereof.

Figure 5:
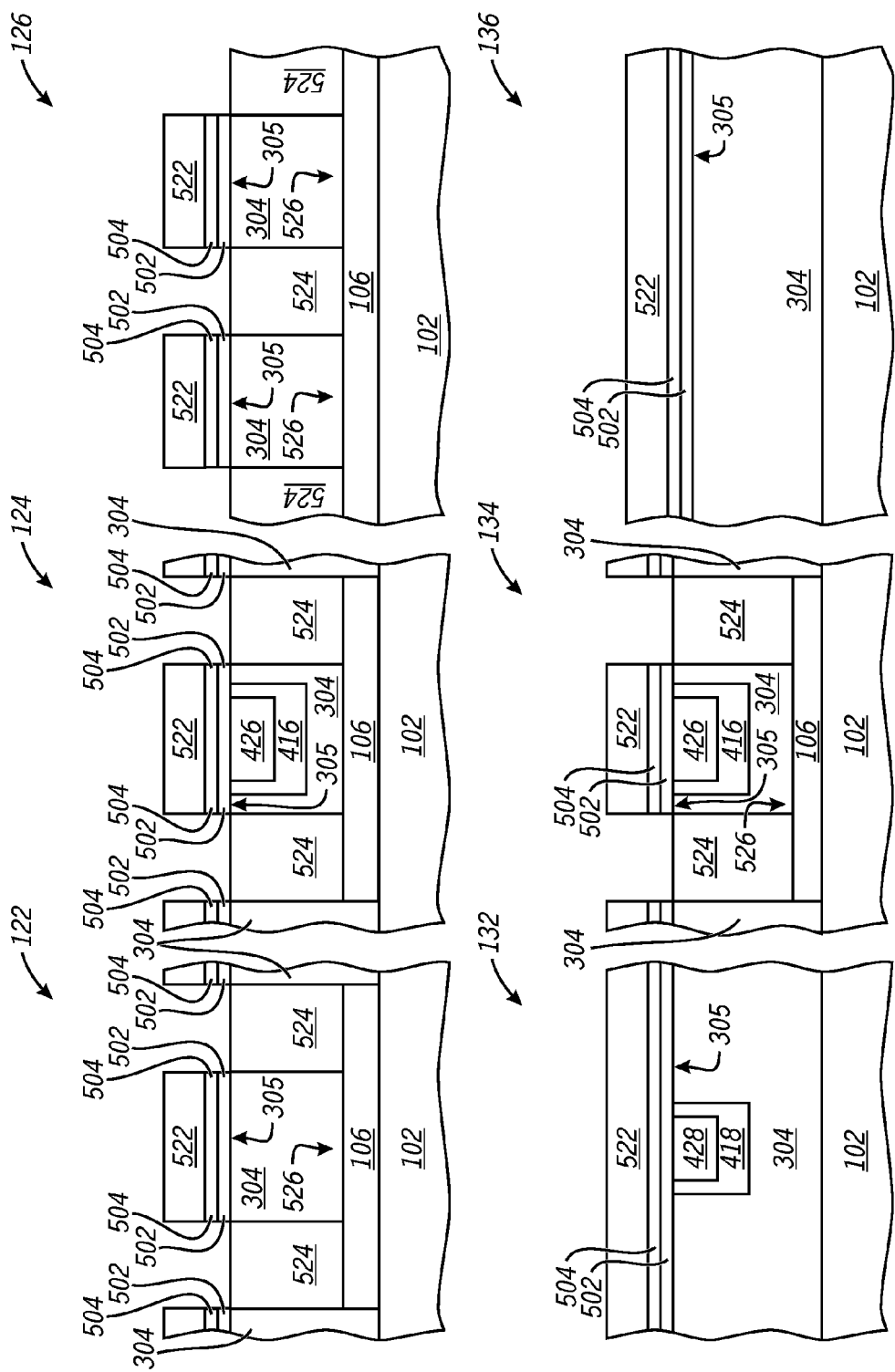
FIG. 5 includes illustrations of cross-sectional views of portions of the workpiece of FIG. 4 after forming a pad layer, a stopping layer, another masking layer, and vertical doped regions within the semiconductor layer.

In FIG. 5, a pad layer 502 and a stopping layer 504 (e.g., a polish-stop layer or an etch-stop layer) are sequentially formed over the semiconductor layer 304 using a thermal growth technique, a deposition technique, or a combination thereof. Each of the pad layer 502 and the stopping layer 504 can include an oxide, a nitride, an oxynitride, or any combination thereof. In an embodiment, the pad layer 502 has a different composition as compared to the stopping layer 504. In a particular embodiment, the pad layer 502 includes an oxide, and the stopping layer 504 includes a nitride.

A patterned masking layer 522 is formed over the stopping layer 504. Openings within the patterned masking layer 522 are formed where vertical doped regions will be formed. The vertical doped regions are formed within sections 122, 124, 126, and 134. Thus, the patterned masking layer 522 covers substantially all of the stopping layer 504 in sections 132 and 136. In a particular embodiment, exposed portions of the pad layer 502 and stopping layer 504 are removed to expose portions of the semiconductor layer 304. In another embodiment (not illustrated), exposed portions of the pad layer 502 or both the pad layer 502 and stopping layer 504 are not etched. The presence of the pad layer 502 or both the pad layer 502 and stopping layer 504 may help to reduce implant channeling during a subsequent implant.

Portions of the semiconductor layer 304 under the openings in the patterned masking layer 522 are implanted to form vertical doped regions 524 of doped structures 526. The implantation may be performed as a single implant or as a plurality of implants. When a plurality of implants is performed, different energies, different species, or different energies and species may be used to for the vertical doped regions 524. The conductivity type of the vertical doped regions 524 can be the same as the buried doped region 106 and opposite that of the buried conductive region 102. In a particular embodiment, the vertical doped regions 524 are p-type and have a dopant concentration of at least approximately $10^{18}$ atoms/cm$^3$. The combination of the vertical doped regions 524 and buried doped region 106 may help to isolate the portions of the semiconductor layer 304 within the sections 122, 124, 126, and 134. Doped structures 526 include combinations of the buried doped regions 106 and the vertical doped regions 524. In subsequent figures, the doped structures 526 may be illustrated without the separate doped buried regions 106 and vertical doped regions 524 therein. After the implant, the patterned masking layer 522 is removed. In another embodiment described later in this specification, the vertical doped regions can be formed using other techniques, or in another embodiment, may be omitted.

Another patterned masking layer (not illustrated) is formed over locations where the pad layer 502 and the stopping layer 504 are to be removed and trenches subsequently formed. At this point in the process, the pad layer 502 and stopping layer 504 may be patterned within the sections 132 and 136. If the pad layer 502 or both the pad layer 502 and stopping layer 504 have not been patterned within the sections 122, 124, 126, and 134, the pad layer 502 or both the pad layer 502 and stopping layer 504 within the sections 122, 124, 126, and 134 can be patterned with the corresponding portions within the section 132, 136, or both. After the pad layer 502 and stopping layer 504 have been patterned within the appropriate sections, the other patterned masking layer is removed.

Figure 6:
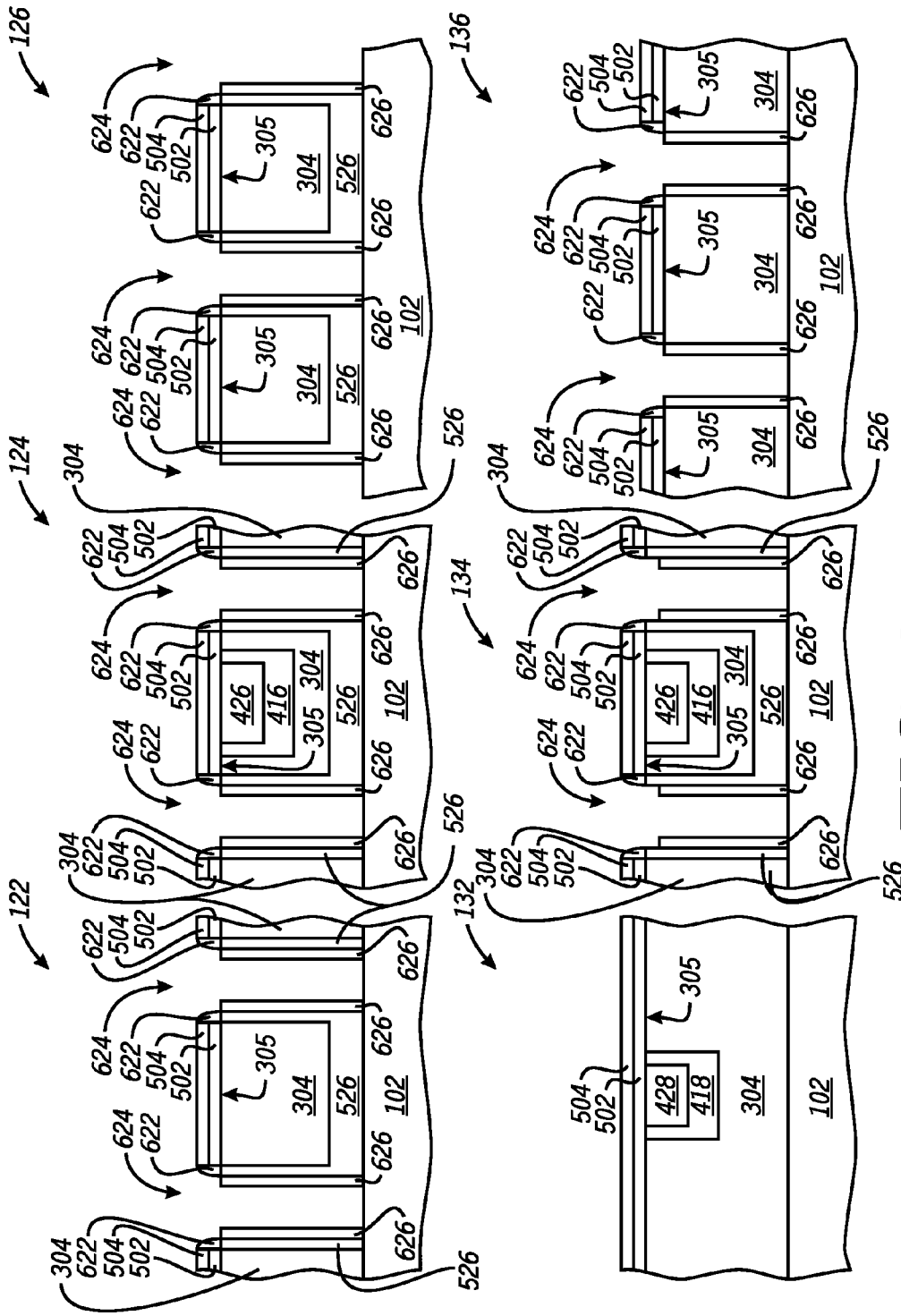
FIG. 6 includes illustrations of cross-sectional views of portions of the workpiece of FIG. 5 after forming sacrificial sidewall spacers, trenches extending through the semiconductor layer, and insulating sidewall spacers.

Sidewall spacers 622 are formed adjacent to openings within the pad layer 502 and the stopping layer 504, as illustrated in FIG. 6. The sidewall spacers 622 can be used to determine the widths of the subsequently-formed trenches and remaining portions of the doped structures 526 lying along sidewalls of the subsequently-formed trenches. The sidewall spacers 622 can be formed by depositing a sacrificial layer and anisotropically etching that layer. In a particular embodiment, the sacrificial layer can include an oxide, a nitride, an oxynitride, or any combination thereof. In a more particular embodiment, the sacrificial layer and the stopping layer 504 have different compositions. The thickness of the sacrificial layer may be no greater than approximately 900 nm or approximately 700 nm, or may be at least approximately 50 nm or approximately 100 nm.

Exposed portions of the semiconductor layer 304 and doped structures 526 are etched to form trenches 624 that extend from the primary surface 305 toward the buried conductive region 102. The trenches 624 extend partly or completely through the semiconductor layer 304 or doped structures 526 and the buried doped regions 106. The widths of the trenches 624 are not so wide that a subsequently-formed conductive layer is incapable of filling the trenches 624. In a particular embodiment, the width of each trench 624 is at least approximately 0.3 micron or approximately 0.5 micron, and in another particular embodiment, the width of each trench 624 is no greater than approximately 4 microns or approximately 2 microns. After reading this specification, skilled artisans will appreciate that narrower or wider widths outside the particular dimensions described may be used. The trenches 624 can extend to the buried conductive region 102; however, the trenches 624 may be shallower if needed or desired. The trenches 624 are formed using an anisotropic etch. In an embodiment, a timed etch can be performed, and in another embodiment, a combination of endpoint detection (e.g., detecting the dopant species from the buried conductive region 102, such as arsenic or antimony) and a timed overetch may be used.

Insulating sidewall spacers 626 can be formed along the exposed sidewalls of the trenches 624. The insulating sidewall spacers 626 can include an oxide, a nitride, an oxynitride, or any combination thereof. The layer from which the insulating sidewall spacers 626 are formed can be thermally grown or deposited, and the layer can be anisotropically etched to remove the layer from the bottoms of the trenches 624. If needed or desired, an etch can be performed to extend the trenches 624 closer to or further into the buried conductive region 102. In another embodiment, the insulating sidewall spacers 626 are not needed or are not formed within all trenches 624. In a particular embodiment, the insulating sidewall spacers 626 are only used within the trenches 624 in sections 132, 134, and 136, and not are used within the trenches 624 in sections 122, 124, and 126. In other embodiments, different combinations of sections with or without the insulating sidewall spacers 626 can be used.

A conductive layer is formed over the stopping layer 504 and within the trenches 624, and in a particular embodiment, the conductive layer substantially fills the trenches 624. The conductive layer can be polycrystalline and include a metal-containing or semiconductor-containing material. In an embodiment, the conductive layer can include a heavily doped semiconductor material, such as amorphous silicon or polysilicon. In another embodiment, the conductive layer includes a plurality of films, such as an adhesion film, a barrier film, and a conductive fill material. In a particular embodiment, the adhesion film can include a refractory metal, such as titanium, tantalum, or the like; the barrier film can include a refractory metal nitride, such as titanium nitride, tantalum nitride, or the like, or a refractory metal-semiconductor-nitride, such as TaSiN; and the conductive fill material can include tungsten or tungsten silicide. In a more particular embodiment, the conductive layer can include Ti/TiN/W. The selection of the number of films and composition(s) of those film(s) depend on electrical performance, the temperature of a subsequent heat cycle, another criterion, or any combination thereof. Refractory metals and refractory metal-containing compounds can withstand high temperatures (e.g., melting points of such materials can be at least 1400° C.), may be conformally deposited, and have a lower bulk resistivity than heavily doped n-type silicon. After reading this specification, skilled artisans will be able to determine the composition of the conductive layer to meet their needs or desires for a particular application.

Figure 7:
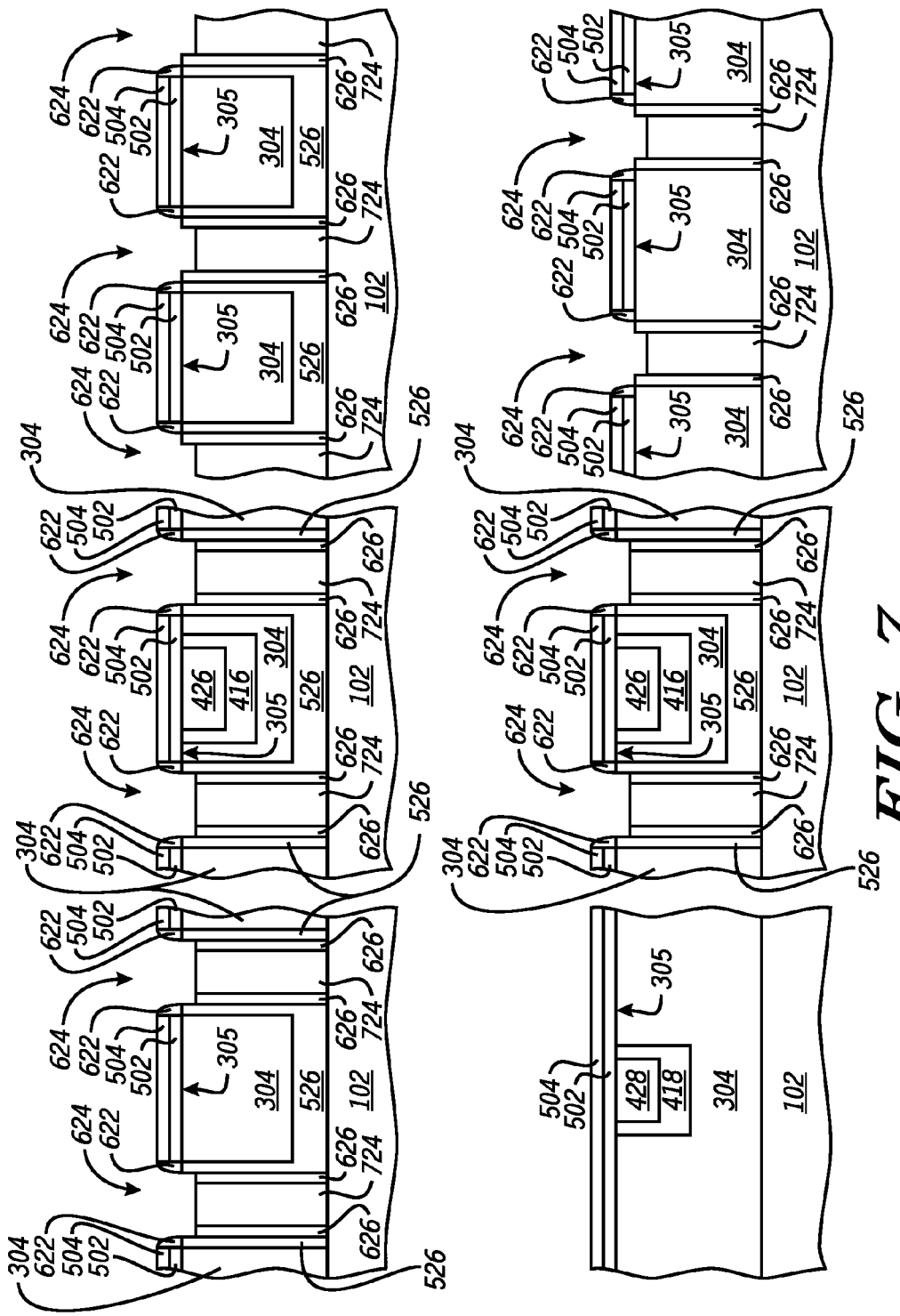
FIG. 7 includes illustrations of cross-sectional views of portions of the workpiece of FIG. 6 after forming conductive structures.

A portion of the conductive layer that overlies the stopping layer 504 is removed to form conductive structures 724 within the trenches 624, as illustrated in the embodiment of FIG. 7. The removal can be performed using a chemical-mechanical polishing or blanket etching technique. The stopping layer 504 may be used as a polish-stop or etch-stop layer. Polishing or etching may be continued for a relatively short time after the stopping layer 504 is reached to account for a non-uniformity across the workpiece with respect to the thickness of the conductive layer, non-uniformity of the polishing or etching operation, or any combination thereof. An etch or other removal operation can be used to recess the conductive structures 724 further into the trenches 624, as illustrated in FIG. 7, if needed or desired. The recessed conductive structures 724 may allow the vertical-oriented doped portions of the doped structures 526 and conductive structures 724 to be electrically connected to one another more readily. The conductive structures 724 form vertically conductive regions. When in the form of a finished electronic device, the combination of conductive structures 724 and buried conductive region 102 electrically connects the source of the high-side power transistor to the drain of the low-side power transistor.

The sidewall spacers 622 and exposed portions of the insulating sidewall spacers 626 within the trenches 624 are removed. The removal can be performed using an isotropic etching technique using a wet or dry etchant. In a particular embodiment, the sidewall spacers 622 and the insulating sidewall spacers 626 include an oxide, and the stopping layer 504 includes a nitride, and therefore, the sidewall spacers 622 and the insulating sidewall spacers 626 can be selectively removed without removing a substantial amount of the stopping layer 504. At this point in the process, portions of the semiconductor layer 304, the doped structures 526, and the conductive structures 724 are exposed.

In another embodiment (not illustrated), within the low-side power transistor in section 136, portions of the semiconductor layer 304 near the trenches 624 may be doped to form part of the drain regions for the low-side power transistor. Similarly, within the high-side power transistor in section 126, portions of the semiconductor layer 304 spaced apart from the trenches 624 may be doped to form part of the drain regions for the high-side power transistor. The same implant step may be used to form both of these doped regions, and a mask may be formed over other sections of the integrated circuit. After portions of the semiconductor layer 304 in section 136 are doped, the mask is removed.

Figure 8:
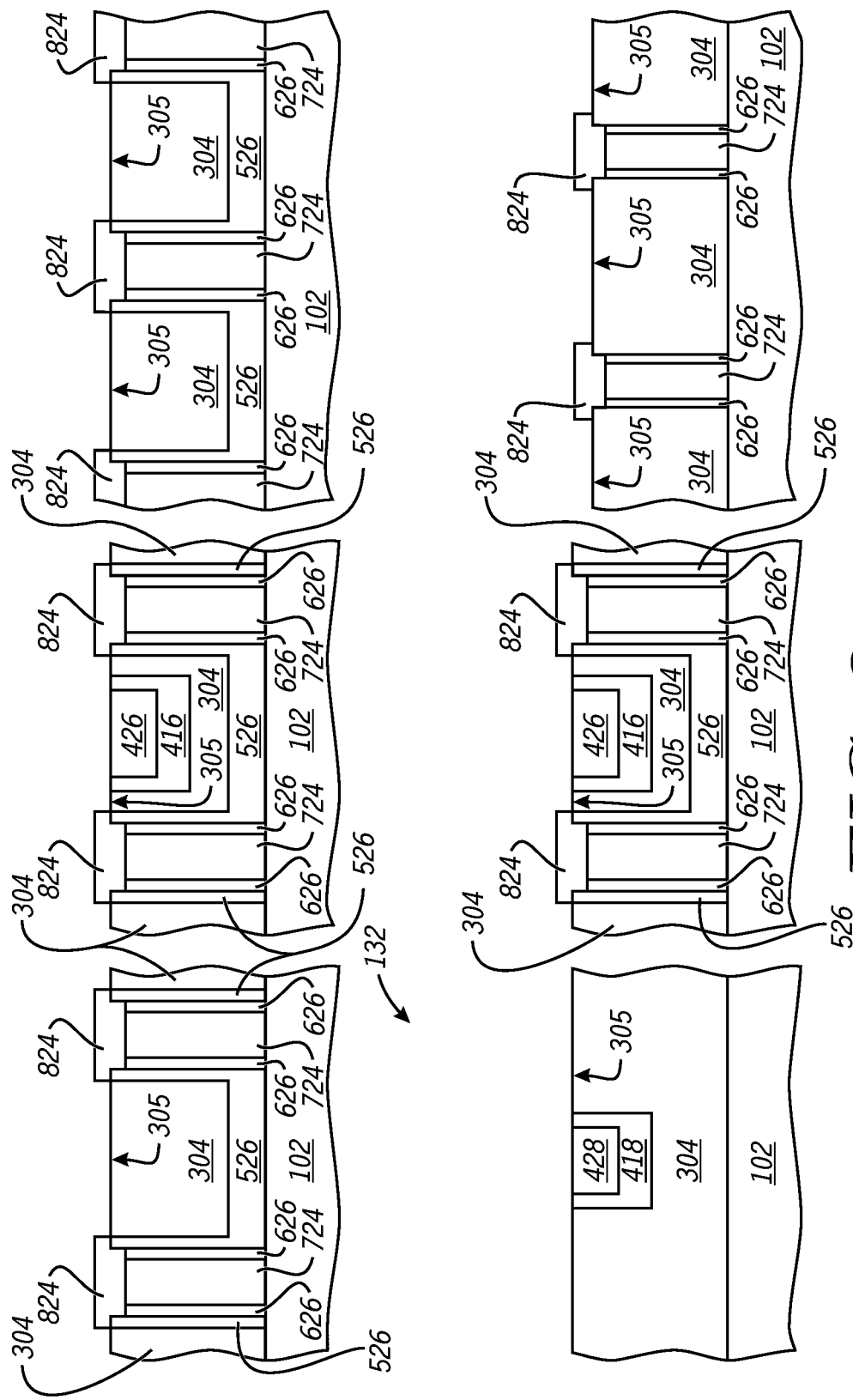
FIG. 8 includes illustrations of cross-sectional views of portions of the workpiece of FIG. 7 after forming conductive plugs.

In FIG. 8, conductive plugs 824 are formed to electrically connect the conductive structures 724 to the doped structures 526 and potentially other regions within the semiconductor layer 304. The conductive plugs 824 can be formed using any of the materials and methods of formation for the conductive structures 724, except that the conductive plugs 824 are not recessed within the trenches 624 in this embodiment. The conductive plugs 824 and conductive structures 724 may be include the same material or different materials and may be formed using the same technique or different techniques. The pad layer 502 and the stopping layer 504 may be removed at this point in the process. In another embodiment, portions of the conductive plugs 824 overlying the semiconductor layer 304 may be removed if desire so that a relatively planar surface is achieved (i.e., the tops of the conductive plugs 824 are at about the same elevation as the primary surface 305 of the semiconductor layer 304).

Figure 9:
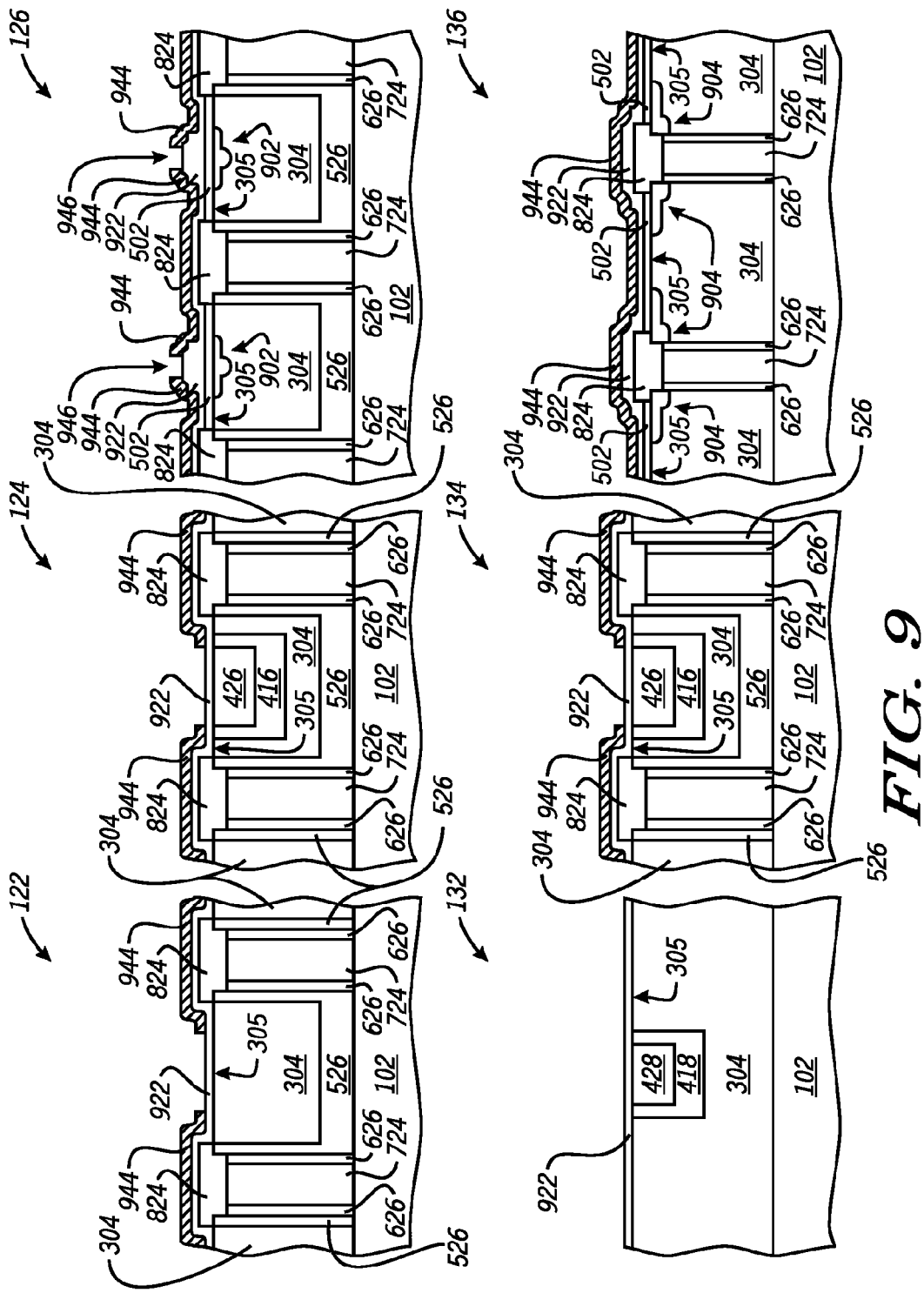
FIG. 9 includes illustrations of cross-sectional views of portions of the workpiece of FIG. 8 after forming an insulating layer and a patterned conductive layer.

At this point in the process, electronic component formation adjacent to the primary surface 305 may begin, or, if fabrication of electronic components has started, fabrication can continue. FIG. 9 includes an illustration of the partly-formed integrated circuit after a portion of the fabrication process is performed. An implant screen layer (not illustrated) can be formed over the primary surface 305. Doped regions can be selectively formed within the semiconductor layer 304 and within the interior portions 426 and 428. The doped regions can include drain regions 902 and 904 for the high-side and low-side power transistors, respectively. Each of the drain regions 902 and 904 includes a relatively higher dopant concentration and deeper portion and a relatively lighter dopant concentration and shallower portion. The deeper portions are highly conductive and are designed to be at a high voltage, and the shallower portions are somewhat more resistive and reduce the voltage near the subsequently-formed gate dielectric layer and gate electrodes. Under normal operating conditions in which a high voltage is applied to the drain of a high-side or low-side power transistor, most or all of the shallower portion of the drain region 902 or 904 will be depleted of carriers, and most or all of the deeper portion of the drain region 902 or 904 will be undepleted of carriers. In a particular non-limiting embodiment, the shallower portions of the drain regions 902 and 904 are horizontally-oriented doped regions that are spaced apart from the buried conductive region 102. In a normal operating state, the principal charge carrier (electrons) or current flow through the shallower portions of the drain regions 902 and 904 will be in horizontal direction.

The deeper portions of the drain regions 902 and 904 can be formed using the same masking layer and doping parameters. The deeper portions may include dopant type opposite that of the doped structures 526 and have a dopant concentration of at least approximately $10^{19}$ atoms/cm$^3$, and the shallower portions may include dopant type opposite that of the doped structures 526 and have a dopant concentration of less than approximately $10^{19}$ atoms/cm$^3$ and at least approximately $10^{16}$ atoms/cm$^3$. In a particular embodiment, the deeper portions can be formed using the same masking layer and the same implant species and other implant parameters compared to each other, and the shallower portions can be formed using the same masking layer and the same implant species and other implant parameters compared to each other; however the masking layers and implant species and parameters can be different for the deeper portions as compared to the shallower portions.

The shallower portions have depths in a range of approximately 0.1 micron to approximately 0.5 microns, and extend laterally from the deeper portions in a range of approximately 0.2 micron to approximately 2.0 microns. The lateral dimension (from the vertically-oriented conductive structure or the deeper portions of the drain regions 902 and 904) can depend on the voltage difference between the source and drain of the power transistor being formed. As the voltage difference between the source and drain of the transistor increases, the lateral dimension can also increase. In an embodiment, the voltage difference is no greater than approximately 30 V, and in another embodiment, the voltage difference is no greater than 20 V. The peak doping concentration within the shallower portions can be in a range of approximately $2 \times 10^{17}$ atoms/cm$^3$ to approximately $2 \times 10^{18}$ atoms/cm$^3$, and in a particular embodiment, in a range of approximately $4 \times 10^{17}$ atoms/cm$^3$ to approximately $7 \times 10^{17}$ atoms/cm$^3$.

In an alternate embodiment, the shallower portions of the drain regions 902 and 904 can extend continuously across the lengths of the unit cells of the high-side and low-side power transistors (i.e., extend to regions where channel and source regions will be subsequently formed). The doping of the channel regions, to be described later, is commensurately increased to counter-dope the portions of the drain regions within the channel regions. The advantage of extending the shallower portions of the drain regions 902 and 904 into the channel regions is that it reduces or eliminates the impact of misalignment of the drain masking layer. In a further embodiment, this masking layer can be eliminated, allowing the implant that forms the shallower portions of the drain regions 902 and 904 to be continuous across the entire workpiece.

An insulating layer 922 is formed over the conductive plugs 824. The insulating layer 922 includes at least two different types of regions having different thicknesses. In effect, the insulating layer 922 has a terraced configuration. Within the high-side and low-side power transistors, as illustrated in FIG. 9, the insulating layer 922 includes three regions each having a different thickness. The insulating layer 922 may or may not include the implant screen layer. The thinner regions of the insulating layer 922 overlie the relatively shallower portions of the drain regions 902 and 904 and overlie portions of the semiconductor layer 304 near the primary surface 305 and outside of the drain regions 902 and 904. The thicker regions overlie the deeper portions of the drain regions 902 and 904. Intermediate regions may lie between the thinner and thicker regions and are an optional feature.

In an embodiment, the thinner regions have a thickness of at least approximately 0.02 microns or at least approximately 0.05 microns, and in another embodiment, the thinner regions have a thickness no greater than approximately 0.2 microns or no greater than approximately 0.1 microns. In an embodiment, the thicker regions have a thickness of at least approximately 0.15 microns or at least approximately 0.25 microns, and in another embodiment, the thicker regions have a thickness no greater than approximately 0.8 microns or no greater than approximately 0.5 microns. The intermediate regions (between the thinner and thicker regions) may have a thickness substantially the same as the thinner region or the thicker region or a thickness in between that of the thinner and thicker regions. In an embodiment, the intermediate regions have a thickness of at least approximately 0.05 microns or at least approximately 0.15 microns, and in another embodiment, the intermediate regions have a thickness no greater than approximately 0.5 microns or no greater than approximately 0.25 microns. In a particular embodiment, the thinner regions have a thickness in a range of approximately 0.03 microns to approximately 0.08 microns, the thicker regions have a thickness in a range of approximately 0.3 microns to approximately 0.5 microns, and the intermediate regions have a thickness in a range of approximately 0.13 microns to approximately 0.2 microns.

The insulating layer 922 can be formed by different techniques and achieve different shapes as seen from cross-sectional views. The insulating layer 922 can be formed from a single insulating film or a plurality of insulating films that are deposited over the workpiece. The single insulating film or the plurality of insulating films can include an oxide, a nitride, an oxynitride, or a combination thereof. In a particular embodiment, the characteristics of the insulating layer 922 may be different for points closer to the implant screen layer 1100 as compared to corresponding points further from the implant screen layer 1100. In an embodiment, the composition of the insulating layer 922 may change during or between depositions. For example, an oxide film may be closer to the semiconductor layer 304, and a nitride film may be deposited over the oxide film. In another embodiment, a dopant, such as phosphorus, can be incorporated at an increasing concentration during a later part of the deposition. In still another embodiment, the stress within the film can be changed by changing deposition parameters (e.g., radio frequency power, pressure, etc.) even though the composition is substantially the same throughout the thickness of the insulating layer 922. In further embodiments, combinations of the foregoing may be used. A mask is formed over the thicker and intermediate region and a patterning technique is used to achieve the desired shape. Those techniques include isotropically etching a portion of the insulating layer 922, alternative etching the insulating material and etching a sidewall etch of the overlying mask, etching the insulating material and etching a sidewall etch of the overlying mask, taking advantage of a differential composition (doped oxide etches faster than undoped oxide), patterning followed by a sidewall spacer, another suitable technique, or any combination thereof.

A conductive layer 944 is deposited over the insulating layer 922 and patterned to form openings 946 where drain contact structures will be subsequently made to the drain regions 902. The conductive layer 944 includes a conductive material or may be made conductive, for example, by doping. More particularly, the conductive layer 944 can include a doped semiconductor material (e.g., heavily doped amorphous silicon, polysilicon, etc.), a metal-containing material (a refractory metal, a refractory metal nitride, a refractory metal silicide, etc.), or any combination thereof. The conductive layer 944 has a thickness in a range of approximately 0.05 microns to approximately 0.5 microns. In a particular embodiment, the conductive layer 944 is a conductive electrode layer that will be used to form a conductive electrode. The conductive layer 944 is patterned, so that the subsequently formed drain contact structures are not electrically shorted to the conductive layer 944. The portions of the conductive layer 944 overlying the conductive plugs 824 within sections 122, 124, 132, and 134 can be used to help shield subsequently-formed overlying interconnects from electrical fields or other electrical effects from the conductive plugs 824 that are electrically connected to the buried conductive region 102.

FIG. 10 includes an illustration of cross-sectional views of substantially completed high-side and low-side power transistors. Many of the features of the transistors have been previously described, and therefore, additional features are described. An insulating layer 1402 is formed over the conductive layer 944 in FIG. 10. The insulating layer 1402 can include a single film or a plurality of films. Each film within the insulating layer 1402 can include an oxide, a nitride, an oxynitride, or any combination thereof. In another particular embodiment, a nitride film lies closest to the conductive layer 944 and has a thickness in a range of approximately 0.05 microns to approximately 0.2 microns. An oxide film overlies the nitride film and has a thickness in a range of approximately 0.2 microns to approximately 0.9 microns. An antireflective film may overlie the oxide film or may be incorporated elsewhere within the insulating layer 1402. For example, the nitride film can be selected with an appropriate thickness to serve as an etch-stop layer and as an antireflective film. In another embodiment, more or fewer films may be used, and thicknesses as described herein are merely illustrative and not meant to limit the scope of the present invention.

The insulating layer 1402, conductive layer 944, and insulating layer 922 are patterned to form openings. The openings are formed over portions of the drain regions 902 and 904. Such portions allow parts of the drain regions 902 and 904 to underlie part of subsequently-formed gate electrodes. Insulating spacers 1404 are formed along sides of the openings. The insulating spacers 1404 electrically insulate the conductive layer 944 from subsequently-formed gate electrodes. The insulating spacers 1404 can include an oxide, a nitride, an oxynitride, or any combination thereof, and have widths at the bases of the insulating spacers 1404 in a range of approximately 50 nm to approximately 200 nm.

A gate dielectric layer 1422, well regions 1426 and 1427, and gate electrodes 1424 and 1425 are formed. Portions of the insulating layer 922 are removed by etching, and the gate dielectric layer 1422 is formed over the exposed surface of the workpiece. In a particular embodiment, the gate dielectric layer 1422 includes an oxide, a nitride, an oxynitride, or any combination thereof and has a thickness in a range of approximately 5 nm to approximately 100 nm, and a conductive layer is formed over the gate dielectric layer 1422. The conductive layer can be part of the gate electrodes 1424 and 1425 but is not separately illustrated. The conductive layer can be conductive as deposited or can be deposited as a highly resistive layer (e.g., undoped polysilicon) and subsequently made conductive. The conductive layer can include a metal-containing or semiconductor-containing material. The thickness of the conductive layer is selected such that, from a top view, substantially vertical edges of the conductive layer are near the edge of the drain regions 902 and 904. In an embodiment, the conductive layer is deposited to a thickness of approximately 0.1 microns to approximately 0.15 microns.

After the conductive layer is formed, the semiconductor layer 304 can be doped to form well regions 1426 and 1427. The conductivity type of the well regions 1426 and 1427 are opposite that of the drain regions 902 and 904. In an embodiment, boron dopant is introduced through the conductive layer and the gate dielectric layer 1422 into semiconductor layer 304 to provide p-type dopant for the well regions 1426 and 1427. In one embodiment, the well regions 1426 and 1427 have depths greater than a depth of subsequently-formed source regions, and in another embodiment, the well regions 1426 and 1427 have depths of at least approximately 0.5 microns. In a further embodiment, the well regions 1426 and 1427 have depths no greater than approximately 2.0 microns, and in still another embodiment, no greater than approximately 1.5 microns. By way of example, the well region 1426 and 1427 can be formed using two or more ion implantations. In a particular example, each ion implantation is performed using a dose of approximately $1.0 \times 10^{13}$ atoms/$cm^2$, and the two implants having energies of approximately 25 KeV and approximately 50 KeV. In another embodiment, more or fewer ion implantations may be performed in forming the well regions. Different doses may be used at the different energies, higher or lighter doses, higher or lower energies, or any combination thereof may be used to meet the needs or desires for a particular application.

In an alternate embodiment (not illustrated), the dose of the ion implantation forming well regions 1426 and 1427 is increased to compensate for the shallower portions of the drain regions 902 and 904 when portions of shallower portions extend across the unit cell of the transistor. In still another embodiment, before forming the conductive layers for the gate electrodes 1424 and 1425, the implant that forms the well regions 1426 and 1427 is performed and uses sidewall spacers 1404 as a hardmask edge instead of a portion of a conductive layer within the gate electrodes 1424 and 1425. In a further particular embodiment, these two embodiments can be combined.

Additional conductive material is deposited on the conductive layer and etched to form to gate electrodes 1424 and 1425. The additional conductive material can include any of the materials previously described with respect to the conductive layer that is deposited over the gate dielectric layer 1422 and before forming the well regions 1426 and 1427. Similar to the prior conductive layer, the additional conductive material can be conductive as deposited or can be deposited as a highly resistive layer (e.g., undoped polysilicon) and subsequently made conductive. As between the conductive layer and additional conductive material, they can have the same composition or different compositions. The thickness of the composite conductive layer, including the conductive layer and the additional conductive material, has a thickness in a range of approximately 0.2 microns to approximately 0.5 microns. In a particular embodiment, the additional conductive material includes polysilicon and can be doped with an n-type dopant during deposition or doped subsequently using ion implantation or another doping technique. The composite conductive layer is anisotropically etched to form gate electrodes 1424 and 1425. In the illustrated embodiment, the gate electrodes 1424 and 1425 are formed without using a mask and have shapes of sidewall spacers. An insulating layer (not illustrated) may be thermally grown from the gate electrodes 1424 and 1425 or may be deposited over the workpiece. The thickness of the insulating layer can be in a range of approximately 10 nm to approximately 30 nm.

Source regions 1432 and 1433 can be formed using ion implantation. The source regions 1432 and 1433 are heavily doped and have an opposite conductivity type as compared to the well regions 1426 and 1427 and the same conductivity type as the drain regions 902 and 904. The portions of the well regions 1426 lying between the source regions 1432 and drains 902 and underlying the gate electrodes 1424 are channel regions for the high-side power transistors, and the portions of the well regions 1427 lying between the source regions 1433 and drains 904 and underlying the gate electrodes 1425 are channel regions for the low-side power transistors.

Insulating spacers 1428 are formed along the gate electrodes 1424 and 1425 and cover portions of the source regions 1432 and 1433 closer to the gate electrodes 1424 and 1425, wherein exposed portions of the source regions 1432 and 1433 lie closer to the conductive plugs 824. The insulating spacers 1428 can include an oxide, a nitride, an oxynitride, or any combination thereof, and have widths at the bases of the insulating spacers 1428 in a range of approximately 50 nm to approximately 500 nm.

The exposed portions of the source regions 1432 and 1433 are etched to expose underlying portions of the well regions 1426 and 1427, respectively. Depending on the composition of the conductive plugs 824, portions of the conductive plugs 824 may or may not be etched when the source regions 1432 and 1433 are etched. If the conductive plugs 824 and the semiconductor layer 304 (from which the well regions 1426 and 1427 and the source regions 1432 and 1433 are formed) are principally silicon, then part or all of exposed conductive plugs 824 may be etched when etching through the source regions 1432 and 1433. If the conductive plugs 824 and source regions 1432 and 1433 include dissimilar materials, substantially none or an insignificant portion of the conductive plugs 824 may be etched when etching through the source regions 1432 and 1433.

Well contact regions 1434 and 1435 are formed from the exposed portions of the well regions 1426 and 1427, respectively. The well contact regions 1434 and 1435 have the same conductivity type as the well regions 1426 and 1427 and have the opposite conductivity type as compared to the source regions 1432 and 1433. In a particular embodiment, the well contact regions 1434 and 1435 have a dopant concentration of at least approximately $10^{19}$ atoms/cm$^3$ to allow ohmic contacts to be subsequently formed.

In another embodiment (not illustrated), an additional implant of the same conductivity type as the well regions 1426 and 1427 and of the opposite conductivity type as the source regions 1432 and 1433 may be used to form well contact regions below the source regions 1432 and 1433. The additional implant may be performed before or after forming the source regions 1432 and 1433 and before forming the insulating spacers 1428. In this embodiment, the well contact regions underlie substantially all of the source regions 1432 and 1433. After the source regions 1432 and 1433 and the well contact regions are formed, the insulating spacers 1428 are formed such that only portions of the source regions 1432 and 1433 are covered. An etch as previously described is performed to remove portions of the source regions 1432 and 1433 and expose portions of the underlying well contact regions.

Returning to the embodiment as illustrated in FIG. 10, portions of the insulating spacers 1428 are etched to expose portions of the source regions 1432 and 1433. Conductive straps 1462 are then formed to electrically connect the source regions 1432, well contact regions 1434, and corresponding conductive plugs 824 together, and other conductive straps 1462 are formed to electrically connect the source regions 1433 and well contact regions 1435 together. In a particular embodiment, a refractory metal, such as Ti, Ta, W, Co, Pt, or the like, can be deposited over the workpiece and selectively reacted with exposed silicon, such as substantially monocrystalline or polycrystalline silicon, to form a metal silicide. Unreacted portion overlie the insulating layer 1402 and insulating spacers 1428 are removed, thus leaving the conductive straps 1462. Although not illustrated, an uppermost portion of the gate electrodes 1424 and 1425 may be exposed and react with the refractory metal. However, a metal silicide at such a location is spaced apart from the metal silicide abutting the source regions 1432 and 1433 and well contact regions 1434 and 1435, and therefore, an electrical short is not formed between the gate electrodes 1424 and 1425 and any of the source regions 1432 and 1433 and well regions 1426 and 1427. At this point in the process, the high-side and low-side power transistors, as illustrated in FIG. 10, are formed. Subsequent processing can be performed to form interconnects or other wirings to properly connect different parts of the integrated circuit to terminals or other parts of the integrated circuit.

Although not illustrated, additional or fewer layers or features may be used as needed or desired to form the electronic device. Field isolation regions are not illustrated but may be used to help electrically isolate portions of the high-side power transistors from the low-side power transistors. In another embodiment, more insulating and interconnect levels may be used. For example, a particular interconnect level can be used for the conductive layer 944 and a different interconnect level can be used to for the gate electrodes 1424 and 1425. A passivation layer can be formed over the workpiece. After reading this specification, skilled artisans will be able to determine layers and features for their particular application.

The electronic device can include many other power transistors that are substantially identical to the power transistors as illustrated in FIG. 10. The high-side power transistors can be connected in parallel to each other, and the low-side power transistors can be connected in parallel to each other. Either or both configurations can give a sufficient effective channel width of the electronic device that can support the relatively high current flow that is used during normal operation of the electronic device. In a particular embodiment, each power transistor may be designed to have a maximum source-to-drain voltage difference of approximately 30 V, and a maximum source-to-gate voltage difference of approximately 20 V. During normal operation, the source-to-drain voltage difference is no greater than approximately 20 V, and the source-to-gate voltage difference is no greater than approximately 9 V. The conductive layer 944 can be kept at a substantially constant voltage with respect to a source terminal of either the high-side or low-side transistor during normal operation to reduce the drain-to-gate capacitance. In a particular embodiment, the conductive layer 944 may be at substantially 0 V, in which case, the conductive layer 944 can act as a grounding plane. In another embodiment, a portion of the conductive layer 944 near the high-side power transistor may be coupled to the source regions 1432, and another portion of the conductive layer 944 near the low-side power transistor may be coupled to the source regions 1433.

Further processing is performed to form electronic components that may partly or completely lie within the interior portions 426 or 428 or other parts of the semiconductor layer 304. Electronic components can include transistors, resistors, capacitors, diodes, or the like. The transistors can include field-effect transistors or bipolar transistors. Each transistor can be designed to normally operate at a source-to-drain or emitter-to-collector voltage difference less than approximately 10 V, a source-to-drain voltage or emitter-to-collector difference between approximately 10 V and approximately 50 V, or a source-to-drain voltage or emitter-to-collector difference greater than approximately 50 V. FIGS. 11 to 15 include illustrations of electronic components that can be formed within the sections 122, 124, 132, and 134, as illustrated in FIG. 9.

Figure 11:
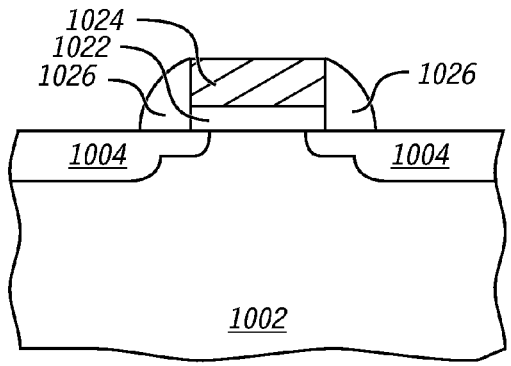
FIGS. 11 to 15 include illustrations of cross-sectional views of portions of the workpiece of FIG. 9 after forming exemplary electronic components in one or more of the sections as described with respect to FIGS. 1 to 9.

FIG. 11 includes a cross-sectional view of a MOSFET structure. Semiconductor region 1002 can be located within the semiconductor layer 304 or within interior portions 426 or 428. A gate dielectric layer 1022 and a gate electrode 1024 can be formed over the semiconductor region 1002. Source/drain regions 1004 can be formed from portions of the semiconductor region 1002. Sidewall spacers 1026 can be formed after forming lightly-doped drains or extension portions of the source/drain regions 1004 and before forming the heavier doped and deeper portions of the source/drain regions 1004. The transistor structure illustrated in FIG. 11 can be a p-channel transistor or an n-channel transistor. The transistor may be an enhancement mode transistor or a depletion mode transistor. In a particular embodiment, the source/drain regions 1004 have a conductivity type opposite that of the semiconductor region 1002. In another embodiment, the source/drain regions 1004 may be electrically connected to each other, and the resulting structure acts as a capacitor.

Additional transistors may be formed to form a circuit such as an inverter, latch, or the like. In a particular embodiment, transistors having transistor structures similar that illustrated in FIG. 11 can allow an n-channel transistor to at least partly lie within the semiconductor layer 304 within section 122, a p-channel transistor to at least partly lie within the interior portion 426 in section 124, another n-channel transistor to at least partly lie within the interior portion 428 within section 132, and another p-channel transistor to at least partly lie within the interior portion 426 in section 134. The electronic components within sections 122 and 124 can be at least part of a control circuit used to control a control electrode (e.g., a gate electrode or base region) of a high-side power transistor, and the electronic components within sections 132 and 134 can be at least part of a control circuit used to control a control electrode (e.g., a gate electrode or base region) of a low-side power transistor.

Figure 12:
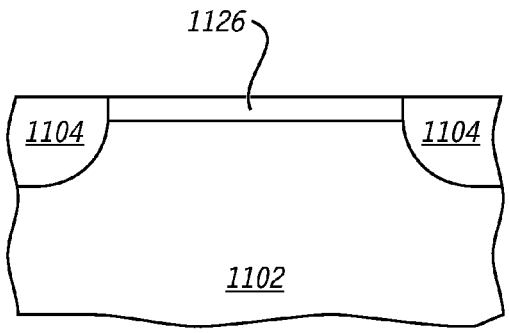

FIG. 12 includes a cross-sectional view of a resistor. Semiconductor region 1102 can be located within the semiconductor layer 304 or within interior portions 426 or 428. Terminal regions 1104 can be formed from portions of the semiconductor region 1102. A resistor body region 1126 can be formed between the terminals. The resistor body region 1126 can be more lightly doped and have a substantially greater affect on the resistance of the resistor as compared to the terminal regions 1104. In a particular embodiment, the terminal regions 1104 and resistor body region 1126 have a conductivity type opposite that of the semiconductor region 1102 and lie completely within the semiconductor region 1102.

Figure 13:
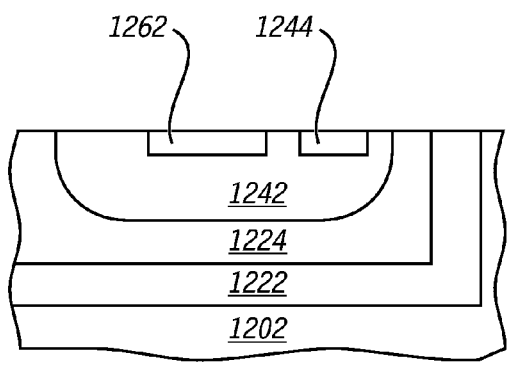

FIG. 13 includes a cross-sectional view of a bipolar transistor. A semiconductor region 1202 can be located within the semiconductor layer 304 or within interior portions 426 or 428. A collector 1222 can be part of the doped structure 416 or 418 or may be separate and spaced apart from the doped structures 416 and 418. A doped region 1224 lies adjacent to the collector 1222. In a particular embodiment, the doped region 1224 has the same conductivity type and a lighter peak dopant concentration as compared to the collector 1222. The doped region 1224 is optional and may be omitted in another embodiment. In the embodiment illustrated in FIG. 13, the collector 1222 surrounds the bottom and side of the base region 1242. The base region 1242 has a conductive type opposite conductivity type and a lighter peak dopant concentration as compared to the collector 1222. A contact region 1244 has the same conductivity type and a heavier peak dopant concentration as compared to the base region 1242. The contact region can allow ohmic contact to be formed to the base region 1242. An emitter region 1262 lies adjacent to the base region 1242. The emitter region 1262 has an opposite conductive type and a heavier peak dopant concentration as compared to the base region 1242. The bipolar transistor as illustrated can be an npn or a pnp bipolar transistor. The bipolar transistor can be a vertical transistor (as determined by the primary current flow), as illustrated in FIG. 13, or a lateral transistor (not illustrated).

Figure 14:
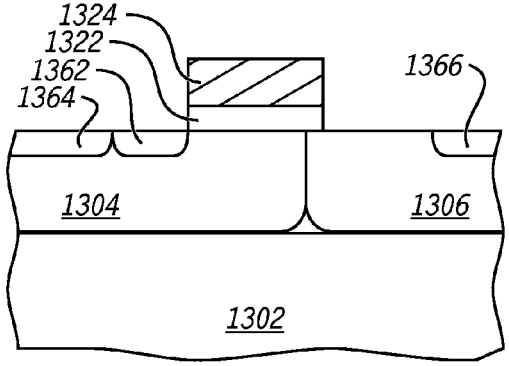

FIG. 14 includes a cross-sectional view of another MOSFET structure. The particular transistor in FIG. 14 is a laterally-diffused MOSFET (LDMOS) transistor. Semiconductor region 1302 can be located within the semiconductor layer 304 or within interior portions 426 or 428. Doped regions 1304 and 1306 can include well regions having different conductivity types. The dopant concentrations for the doped regions 1304 and 1306 may be the same or different from each other.

A gate dielectric layer 1322 and a gate electrode 1324 can be formed over the doped region 1304. A source region 1362 and a body contact region 1364 can be formed from portions of the doped region 1304, and a drain region 1366 can be formed from a portion of the doped region 1306. The source region 1362 has an opposite conductive type and a heavier peak dopant concentration as compared to the doped region 1304. The body contact region 1364 has the same conductive type and a heavier peak dopant concentration as compared to the doped region 1304. In a particular embodiment, the source region 1362 and body contact regions 1364 are electrically connected to each other. The drain region 1366 has the same conductive type and a heavier peak dopant concentration as compared to the doped region 1306. The portion of the doped region 1304 between the source region 1362 and the doped region 1306 and adjacent to the gate dielectric layer 1322 is a channel region for the LDMOS transistor. The LDMOS transistor can be an n-channel transistor or a p-channel transistor.

Figure 15:
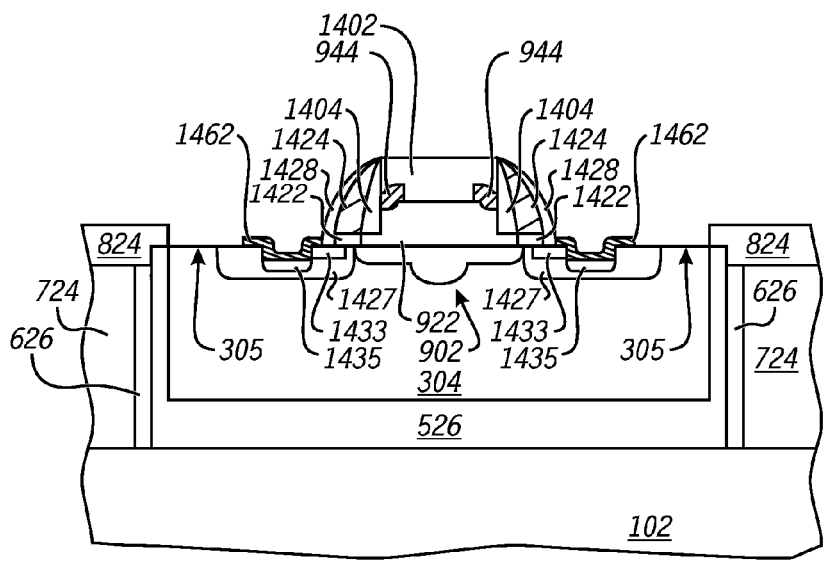

FIG. 15 includes a cross-sectional view of a particular transistor that has features from the high-power and low-power transistors as illustrated and described with respect to FIG. 10. Unlike the high-side and low-side power transistors, the particular transistor does not have an electrode electrically connected to the buried conductive region 102. Thus, the transistor structure is spaced apart from the conductive structures 724 and the conductive plugs 824. The particular transistor can be an n-channel transistor or a p-channel transistor. An advantage of this structure over the LDMOS transistor in FIG. 14 is that no additional processing steps over forming the high-side power transistor are needed, and that its intrinsic electrical characteristics, such as threshold and breakdown voltages, can be similar to the high-side transistor.

The bipolar transistor, the LDMOS transistor, and the particular transistor, all of which are illustrated in FIGS. 13, 14, and 15, can be power transistors that normally operate at a source-to-drain voltage higher than digital logic transistors, such as the transistor illustrated in FIG. 11, and less than the high-side and low-side power transistors. In a non-limiting example, such transistors may normally operate at a source-to-drain voltage of approximately 10 V to approximately 50 V, and the high-side and low-side power transistors that normally operate at a source-to-drain voltage greater than approximately 50 V. In other embodiment, different ranges of source-to-drain voltages can be used for the power transistors. If needed or desired, any transistor as illustrated in FIG. 13, 14, or 15 may be used in place of or in conjunction with another transistor as illustrated in FIG. 13, 14, or 15.

FIGS. 10 to 15 include some electronic components that can be formed as described herein. After reading this specification, skilled artisans will appreciate that other electronic components may be formed in addition to or instead of the electronic components previously described. In another embodiment, not all of sections 122, 124, 126, 132, 134, and 136 need to be formed. For example, if only n-channel transistors and no p-channel transistors are formed, sections 124 and 134 may not be needed and can be omitted, or if only p-channel transistors and no n-channel transistors are formed, sections 122 and 132 may not be needed and can be omitted. After reading this specification, skilled artisans can tailor a design of the integrated circuit for a particular application.

In accordance with the concepts described herein, an integrated circuit can be formed such that the high-side and low-side power transistors are integrated with control logic and potentially other circuitry within different parts of the same die. Parasitic resistance and inductance can be lowered because wire bonds between separate die for the high-side power transistor, the low-side power transistor, and control circuitry for the power transistors are no longer required. The lower parasitic resistance and inductance improves the performance of the electronic device and can allow for a smaller electronic device to be formed.

One particular benefit of reducing the parasitic inductance between the transistors in the different regions allows for less delay time in receiving a control signal at the control electrode of the high-side and low-side transistors and reduces ringing of the switching or output node when switching between the high-side and low-side power transistors. During this transient, the parasitic inductance between the high-side and low-side power transistors reacts with the output capacitance of the low-side transistor to form a resonant circuit. This resonant circuit can create undesirable, high frequency voltage swings on the output node of the circuit. These voltage swings can create undesirable voltage stresses on the devices, complicate the control circuitry, and reduce the overall power conversion efficiency of the voltage regulator. Embodiments described herein can enable a reduction in the parasitic inductance between the high-side and low-side power transistors, thereby minimizing output node ringing. Furthermore, the remaining parasitic between the high-side and low-side power transistors is dominated by the resistance of the buried conductive layer, resulting in a more effective damping of the ringing at the output node.

The parasitic resistance between the two transistor types can be reduced even more by combining small high-side and low-side power transistors in pairs, and then connecting multiple pairs of these transistors together in parallel to create a larger effective device. If the average lateral distance between the high-side and low-side power transistors in these pairs is less than the thickness of the buried conductive layer, then current from the high-side transistor does not have to flow through the entire thickness of the buried conductive layer to reach the low-side transistor, thereby reducing the total parasitic resistance.

Other embodiments can be used if needed or desired. Attention is now directed to alternatives for variations regarding well regions and other doped regions within the semiconductor layer 304 and vertical conductive structures.

Figures 16, 17:
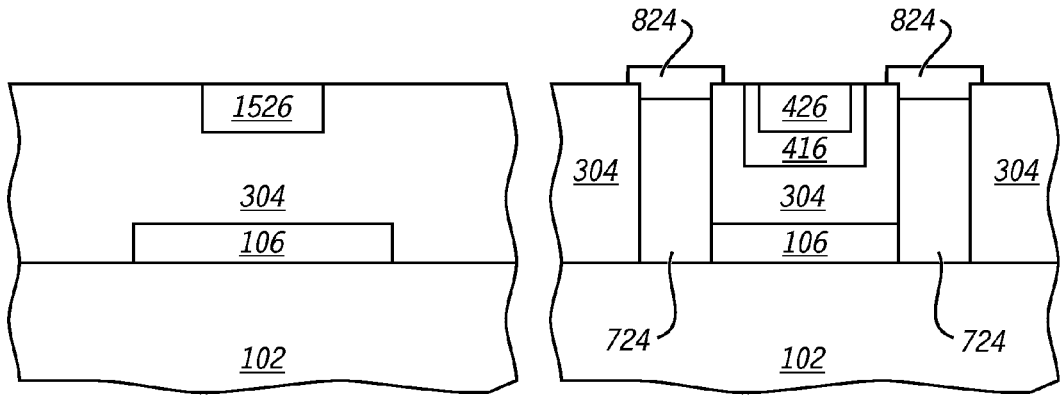
FIG. 16 includes an illustration of a cross-sectional view of a portion of the workpiece of FIG. 1 after forming a semiconductor layer and doped region within the semiconductor layer in accordance with an alternative embodiment.
FIG. 17 includes an illustration of a cross-sectional view of a portion of the workpiece of FIG. 4 after forming trenches, conductive structures, and conductive plugs in accordance with an alternative embodiment.

As previously described, in FIG. 4, section 124 includes an illustration of a portion of the integrated circuit in which a doped structure 416, including a buried doped region 206 and vertical portions 406 surround an interior portion 426 of the semiconductor layer 304. As previously noted, the doped structure may not be needed. In FIG. 16, a doped region 1526 can be formed by doping a portion of the semiconductor layer where the interior portion 426 would otherwise lie. In a particular embodiment, the implant screen layer, similar to the implant screen layer 402 in FIG. 4, and a masking layer are formed over the semiconductor layer 304. In this embodiment, the opening in the masking layer corresponds to a location where dopant is to be introduced into the semiconductor layer 304. The dopant is implanted into the semiconductor layer 304 to form the doped region 1526. The conductivity type of the doped region 1526 may be the same or different conductivity type as compared to the semiconductor layer 304. The doped region 1526 may be a well region by itself or part of a larger well region that includes part of the semiconductor layer 304. In a particular embodiment, the dopant concentration of the doped region 1526 is closer to the dopant concentration of the semiconductor layer 304 than to the buried doped region 106. Processing may continue as previously described. A doped region similar to doped region 1526 may be formed in place of the doped structures 416 and 418 and interior portions 426 and 428 in sections 134 and 132, respectively, or may be formed from a portion of the semiconductor layer in section 122. After reading this specification, skilled artisans will be able to determine whether and where doped regions, similar to doped region 1526, or combinations of doped structures 416 and 418 and interior portions 426 and 428 are to be formed, or none (i.e., no doped regions or combinations) are to be formed in particular sections of the integrated circuit.

As previously described, in FIG. 5, the vertical doped regions 524 of the doped structures 526, and in FIG. 6, after forming the trenches 624, the insulating sidewall spacers 626 are formed along walls of the trenches 624. In another embodiment, the vertical doped regions 524, the insulating sidewall spacers 626, or both are omitted. The vertical doped regions 524 may be omitted when the area (from a top view) occupied by the buried doped region in a particular section is significantly larger than the potential interfacial area between the vertical doped regions 524 and the semiconductor layer 304 within the same section. Additionally, skilled artisans may consider the electrical fields within the section to determine if vertical doped regions 524 can be omitted without a significantly adverse impact. Typically, if any vertical doped region 524 is used, adding additional vertical doped regions 524 may be used without causing additional processing steps or complexity.

Referring to FIG. 17, in one particular embodiment, the process sequence used to form the vertical doped regions 524 is not performed. Trenches, similar to the trenches 624, are formed that extend partly or completely through the semiconductor layer 304. The process sequence used to form the insulating sidewall spacers 626 is omitted in this particular embodiment. The conductive structures 724 are then formed within the trenches, and the conductive plugs 824 and then formed using any of the techniques as previously described. The buried doped region 106 and the buried conductive structure 102 are electrically connected to each other by the conductive structures 724.

Figures 18, 19:
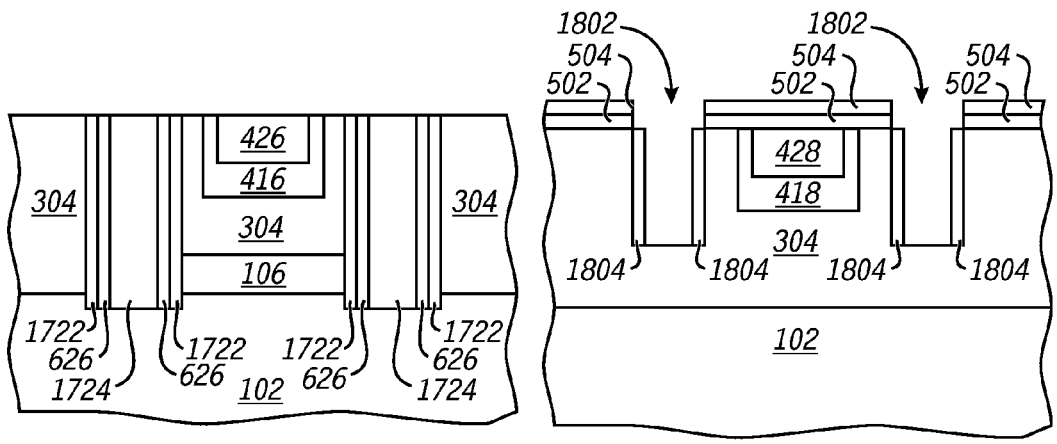
FIG. 18 includes an illustration of a cross-sectional view of a portion of the workpiece of FIG. 4 after forming trenches, doped semiconductor spacers, insulating sidewall spacers, and conductive structures in accordance with an alternative embodiment.
FIG. 19 includes an illustration of a cross-sectional view of a portion of the workpiece of FIG. 4 after forming trenches and insulating sidewall spacers in accordance with an alternative embodiment.

In still another embodiment, vertical doped regions, such as the vertical doped regions 524, can be formed using a different technique, and the conductive plugs 824 may not be formed within all sections or may not be formed at all. In FIG. 18, a doping sequence used to form the vertical doped regions 524 can be omitted. After forming trenches extending through the semiconductor layer 304, a doped semiconductor layer is conformally deposited over the workpiece, including the pad layer 502 and stopping layer 504 (not illustrated in FIG. 18), and within the trenches. The doped semiconductor layer is anisotropically etched to remove portions of the doped semiconductor layer overlying the stopping layer 504 and the bottoms of the trenches and leave doped semiconductor spacers 1722. The doped semiconductor spacers 1722 can have the same dopant type and concentration as the vertical doped regions 524 as previously described. The insulating sidewall spacers 626 can be formed as previously described. Vertical conductive structures 1724 can be formed using any of the techniques described with respect to the vertical conductive structures 1724 except that tops of the vertical conductive structures 1724 are not recessed within the trenches. The pad layer 502 and the stopping layer 504 can be removed, if they were not previously removed after forming the insulating sidewall spacers 626. In another embodiment, vertical conductive structures 1724 and combinations of the vertical conductive structures 724 and conductive plugs 824 may be formed in different sections of the same integrated circuit.

Figure 20:
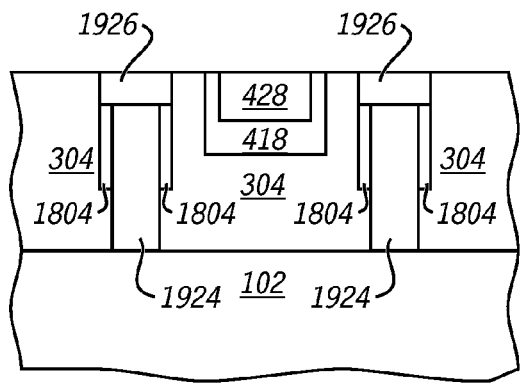
FIG. 20 includes an illustration of a cross-sectional view of a portion of the workpiece of FIG. 18 after extending the trenches and forming conductive structures and conductive plugs in accordance with an alternative embodiment.

In another embodiment, another type of vertical conductive structure can be formed. For example, a vertical conductive structure may be formed within the section 132, although none is illustrated in FIGS. 7 to 9. Referring to FIG. 19, trenches 1802 can be formed using any of the techniques as described with respect to the trenches 624 except that the trenches 1802 only partly extend through the semiconductor layer 304 towards the buried conductive region 102. Insulating sidewall spacers 1804 can be formed using any of the techniques described with respect to the insulating sidewall spacers 626. Another etch is performed to extend the trenches to the buried conductive region 102. In FIG. 20, conductive structures 1924 and conductive plugs 1926 are formed using any of the techniques used to form the structures 724 and conductive plugs 824 as previously described. In another embodiment, combinations of the vertical conductive structures 1924 and conductive plugs 1926 and combinations of the vertical conductive structures 724 and conductive plugs 824 may be formed in different sections of the same integrated circuit. In still another embodiment (not illustrated), trenches may not be extended completely to the buried conductive region 102. Trenches can be formed that have bottoms that are adjacent to but do not reach the buried conductive layer. A doped semiconductor material can be formed within the trenches, and a diffusion operation can be performed to diffuse dopant to the buried conductive region 102.

After reading this specification, skilled artisans will appreciate that many other embodiments may be used without departing from concepts as described herein. The flexibility in use and formation of different structures and doped regions allow skilled artisans to tailor structures and process flows to achieve different applications or to better leverage existing equipment and technologies without having to develop new process steps or process flows with complicated processing sequences. If needed or desired conductivity types may be reversed for all or a portion of the integrated circuit.

Embodiments as described herein may include regions having a peak dopant concentration of less than approximately $10^{19}$ atoms/cm$^3$. Should an ohmic contact with a metal-containing material be needed or desired, a portion of such doped region may be locally doped to have a peak dopant concentration of at least approximately $10^{19}$ atoms/cm$^3$. In a non-limiting example, the buried doped region 106 may have a peak dopant concentration less than approximately $10^{19}$ atoms/cm$^3$. If the conductive structures 724 include W or WSi, portions of the buried doped region 106 near the conductive structures 724, such as along the bottom of the trenches 624, may be implanted to increase locally the peak dopant concentration to be at least approximately $10^{19}$ atoms/cm$^3$ to help form ohmic contacts between the buried doped region 106 and conductive structures 724.

Many different aspects and embodiments are possible. Some of those aspects and embodiments are described below. After reading this specification, skilled artisans will appreciate that those aspects and embodiments are only illustrative and do not limit the scope of the present invention.

In a first aspect, an electronic device can include an integrated circuit that can include a buried conductive region and a semiconductor layer overlying the buried conductive region. The semiconductor layer has a primary surface and an opposing surface, and the buried conductive region may lie closer to the opposing surface than to the primary surface. The electronic device can also include a first vertical conductive structure extending through the semiconductor layer and electrically connected to the buried conductive region. The electronic device can further include a first doped structure and a first well region. The first doped structure can have an opposite conductivity type as compared to, lying closer to the opposing surface than to the primary surface, and being electrically connected to the buried conductive region. The first well region can include a first portion of the semiconductor layer, wherein the first portion overlies the first doped structure, and the first portion has a lower dopant concentration as compared to the first doped structure.

In an embodiment of the first aspect, the first doped structure includes a horizontal portion that lies adjacent to the buried conductive region, includes a vertical portion that lies adjacent to the first vertical conductive structure, and is electrically connected to the first vertical conductive structure. In another embodiment, the first well region further includes a second doped structure wherein the second doped structure is spaced apart from the first doped structure, the first doped structure surrounds the second doped structure, and the second doped structure has a higher dopant concentration as compared to the first portion. In still another embodiment, the first well region and the buried conductive region have the same conductivity type or opposite conductivity types.

In a further embodiment of the first aspect, the electronic device further includes a second well region that includes a second portion of the semiconductor layer, wherein the second well region is spaced apart from the first well region and the first doped structure. In a particular embodiment, the electronic device further includes a second vertical conductive structure extending through the semiconductor layer and electrically connected to the buried conductive region, and further includes a second doped structure spaced apart from the first doped structure and having an opposite conductivity type as compared to the buried conductive region. The second doped structure can include a horizontal portion that lies adjacent to the buried conductive region, and a vertical portion that lies adjacent to the second vertical conductive structure, be electrically connected to the second vertical conductive structure, and surround the second portion of the semiconductor layer.

In another particular embodiment of the first aspect, the electronic device further includes a second vertical conductive structure extending through the semiconductor layer and electrically connected to the buried conductive region. The electronic device still further includes a second doped structure spaced apart from the first doped structure, having an opposite conductivity type as compared to the buried conductive region, lying closer to the opposing surface than to the primary surface, and is electrically connected to the buried conductive region. In still another particular embodiment, the second well region further includes a second doped structure, wherein the second doped structure abuts and surrounds the second portion, and the second doped structure has a higher dopant concentration as compared to the second portion.

In a further particular embodiment, the electronic device further includes a third well region that includes a third portion of the semiconductor layer, wherein the third well region is spaced apart from the first and second well regions. In a more particular embodiment, the third well region further includes a second doped structure, wherein the second doped structure abuts and surrounds the third portion, and the second doped structure has a higher dopant concentration and a same conductivity type as compared to the third portion. In another more particular embodiment, the electronic device further includes a fourth well region that includes a fourth portion of the semiconductor layer, wherein the fourth well region is spaced apart from the first, second, and third well regions.

In another embodiment of the first aspect, the electronic device further includes a second vertical conductive structure and a second doped structure. The vertical conductive structure extends through the semiconductor layer and electrically connected to the buried conductive region. The second doped structure has an opposite conductivity type as compared to the buried conductive region, and the second doped structure includes a horizontal portion that lies adjacent to the buried conductive region, and a vertical portion that lies adjacent to the third vertical conductive structure. The second doped structure is electrically connected to the second vertical conductive structure. The first well region and the fourth well region have opposite conductivity types. In a particular embodiment, the first well region is a p-well region, the second well region is an n-well region, the third well region is another p-well region, and the fourth well region is another n-well region.

In a more particular embodiment of the first aspect, the integrated circuit further includes a first power transistor and a second power transistor. The first power transistor includes a first current-carrying electrode, a second current-carrying electrode, and a first control electrode, wherein the first current-carrying electrode is coupled to a first terminal. The second power transistor includes a third current-carrying electrode, a fourth current-carrying electrode, and a second control electrode. In the integrated circuit, the second current-carrying electrode, the third current-carrying electrode, and the buried conductive region are electrically connected to one another. The fourth current-carrying electrode is coupled to a second terminal designed to operate at a different voltage than the first terminal. The integrated circuit further includes a first electronic component within the first well region, wherein the first component is part of a first control circuit coupled to the first control electrode, and a second electronic component within the second well region, wherein the second component is part of the first control circuit coupled to the first control electrode. The integrated circuit still further includes a third electronic component within the third well region, wherein the third component is part of a second control circuit coupled to the second control electrode, and a fourth electronic component within the fourth well region, wherein the fourth component is part of the second control circuit coupled to the second control electrode.

In a second aspect, an electronic device can include an integrated circuit that includes a buried conductive region and a semiconductor layer overlying the buried conductive region. The semiconductor layer can have a primary surface and an opposing surface, and the buried conductive region may lie closer to the opposing surface than to the primary surface. The electronic device can also include a first vertical conductive structure extending through the semiconductor layer and electrically connected to the buried conductive region. The electronic device can still further include a first well region including a first doped structure, wherein the first doped structure is spaced apart from each of the buried conductive region and the first vertical conductive structure. The electronic device can still further include a field-effect transistor that at least partly lies within the first well region.

In another embodiment of the second aspect, the electronic device further includes a second vertical conductive structure extending through the semiconductor layer and electrically connected to the buried conductive region. The electronic device can also include a second doped structure within the semiconductor layer, wherein the second doped structure lies adjacent to the buried conductive region and the first vertical conductive structure. The electronic device can further include a second well region that includes an interior portion of the semiconductor layer. The second doped structure surrounds the interior portion of the semiconductor layer, and the first well region and the second well region have opposite conductivity types.

In a third aspect, a process of forming an electronic device including an integrated circuit can include providing a substrate that includes a semiconductor layer overlying a buried conductive region, wherein the semiconductor layer has a primary surface and an opposing surface, and the buried conductive region lies closer to the opposing surface than to the primary surface. The method can also include forming a first doped structure within the semiconductor layer, wherein the first doped structure lies closer to the opposing surface than to the primary surface, and has an opposite conductivity type as compared to the buried conductive region. The method can further include forming a first vertical conductive structure extending through the semiconductor layer. In a finished device, a first well region can include a first portion of the semiconductor layer that overlies the first doped structure, and the buried conductive region, the first doped structure, and the first vertical conductive structure are electrically connected to one another.

In an embodiment of the third aspect, providing the substrate and forming the first doped structure include providing a substrate that includes a first part of the semiconductor layer over the buried conductive region, selectively doping the first part of the semiconductor layer to form a first horizontal portion of the first doped structure, epitaxially growing a second part of the semiconductor layer, and selectively doping the second part of the semiconductor layer to form a first vertical portion of the first doped structure. In another embodiment, the process further includes forming a second well region that includes a second portion of the semiconductor layer, wherein the second well region has an opposite conductivity type as compared to the first well region. In a particular embodiment, the process further includes forming a second horizontal portion of a second doped structure within the semiconductor layer, wherein the second horizontal portion is spaced apart from the buried conductive region. The process can also include forming a second vertical portion of the second doped structure, wherein the second vertical portion lies between the second horizontal portion and the primary surface of the semiconductor layer. In a finished device, the second well region further includes the second doped structure, and the second doped structure surrounds and has a higher dopant concentration than the second portion of the semiconductor layer.

In another particular embodiment of the third aspect, the process further includes forming a third well region that includes a third portion of the semiconductor layer, wherein the third well region is spaced apart from the first and second well regions. In a more particular embodiment, the process further includes forming a second horizontal portion of a second doped structure within the semiconductor layer, and forming a second vertical portion of the second doped structure, wherein the second vertical portion lies between the second horizontal portion and the primary surface of the semiconductor layer. In a finished device, the third well region includes the second doped structure, the second doped structure surrounds the third portion of the semiconductor layer, and the second doped structure has a same conductivity type and a higher dopant concentration as compared to the third portion of the semiconductor layer.

In another embodiment of the third aspect, the process further includes forming a fourth well region that includes a fourth portion of the semiconductor layer, wherein the fourth well region is spaced apart from the first, second, and third well regions. In a particular embodiment, the process further includes forming a second horizontal portion of a second doped structure within the semiconductor layer, wherein the second horizontal portion abuts the buried conductive region. The process also includes forming a second vertical portion of the second doped structure, wherein the second vertical portion of the second doped structure lies between the second horizontal portion of the second doped structure and extends along a majority of a thickness of the semiconductor layer. The process further includes forming a second vertical conductive structure extending through the semiconductor layer. In a finished device, the second doped structure surrounds the fourth portion of the semiconductor layer, the first well region and the fourth well region have opposite conductivity types, and the buried conductive region, the second vertical conductive structure, and the doped region are electrically connected to one another. In another particular embodiment, the first well region is a p-well region, the second well region is an n-well region, the third well region is another p-well region, and the fourth well region is another n-well region.

In a more particular embodiment of the third aspect, the process further includes forming a first electronic component within the first well region, wherein the first electronic component is part of a first control circuit, forming a second electronic component within the second well region, wherein the second electronic component is part of the first control circuit, forming a third electronic component within the third well region, wherein the third electronic component is part of a second control circuit, and forming a fourth electronic component within the fourth well region, wherein the fourth electronic component is part of the second control circuit. The process can also include forming a first current-carrying electrode, a second current-carrying electrode, and a first control electrode of a first power transistor, forming a third current-carrying electrode, a fourth current-carrying electrode, and a second control electrode of a second power transistor, and coupling the second current-carrying electrode and the third current-carrying electrode to the buried conductive region. The process can further include coupling the first control circuit to the first control electrode, coupling the second control circuit to the second control electrode, coupling the first current-carrying electrode is coupled to a first terminal and coupling the fourth current-carrying electrode to a second terminal designed to operate at a different voltage than the first terminal.

Note that not all of the activities described above in the general description or the examples are required, that a portion of a specific activity may not be required, and that one or more further activities may be performed in addition to those described. Still further, the order in which activities are listed is not necessarily the order in which they are performed.

Certain features are, for clarity, described herein in the context of separate embodiments, may also be provided in combination in a single embodiment. Conversely, various features that are, for brevity, described in the context of a single embodiment, may also be provided separately or in any subcombination. Further, reference to values stated in ranges includes each and every value within that range.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. An electronic device including an integrated circuit comprising:
   a buried conductive region;
   a semiconductor layer overlying the buried conductive region, wherein the semiconductor layer has a primary surface and an opposing surface, and the buried conductive region lies closer to the opposing surface than to the primary surface;
   a first well region having an opposite conductivity type as compared to the buried conductive region and including a first doped structure and a first portion of the semiconductor layer, wherein:
      from a cross-sectional view, the first doped structure has a U-shape;
      the first portion is defined by and overlies the first doped structure; and
      the first portion has a lower dopant concentration as compared to the first doped structure; and
      the first doped structure:
         includes a horizontal portion that lies adjacent to the buried conductive region; and
         includes a vertical portion that lies adjacent to the first vertical conductive structure; and
   a first vertical conductive structure extending through the semiconductor layer and electrically connected to the buried conductive region and the first doped structure.

2. The electronic device of claim 1, further comprising a second doped structure wherein:
   the first doped structure surrounds the second doped structure; and
   the second doped structure has a higher dopant concentration as compared to the first portion.

3. The electronic device of claim 1, wherein the first portion of the semiconductor layer surrounds the second doped structure.

4. The electronic device of claim 1, wherein the second doped structure has a U-shape and a same conductivity type as the buried conductive region.

5. The electronic device of claim 1, further comprising a second well region that includes a second portion of the semiconductor layer, wherein the second portion is spaced apart from the first well region.

6. The electronic device of claim 5, further comprising:
   a second vertical conductive structure extending through the semiconductor layer and electrically connected to the buried conductive region; and
   a second doped structure spaced apart from the first doped structure, having a same conductivity type as compared to the buried conductive region, being spaced apart from the buried conductive region by a portion of the semiconductor layer.

7. The electronic device of claim 5, wherein the second well region further comprises a second doped structure, wherein:
   the second doped structure abuts and surrounds the second portion; and
   the second doped structure has a higher dopant concentration as compared to the second portion.

8. The electronic device of claim 5, further comprising a third well region that includes a third portion of the semiconductor layer, wherein the third well region is spaced apart from the first and second well regions.

9. The electronic device of claim 8, further comprising a fourth well region that includes a fourth portion of the semiconductor layer, wherein the fourth well region is spaced apart from the first, second, and third well regions.

10. The electronic device of claim 9, wherein:
the first well region is a p-well region;
the second well region is an n-well region;
the third well region is another p-well region; and
the fourth well region is another n-well region.

11. The electronic device of claim 10, wherein the integrated circuit further comprises:
a first power transistor including a first current-carrying electrode, a second current-carrying electrode, and a first control electrode, wherein the first current-carrying electrode is coupled to a first terminal;
a second power transistor including a third current-carrying electrode, a fourth current-carrying electrode, and a second control electrode, wherein the second current-carrying electrode, the third current-carrying electrode, and the buried conductive region are electrically connected to one another, and the fourth current-carrying electrode is coupled to a second terminal designed to operate at a different voltage than the first terminal;
a first electronic component within the first well region, wherein the first component is part of a first control circuit coupled to the first control electrode;
a second electronic component within the fourth well region, wherein the second component is another part of the first control circuit coupled to the first control electrode;
a third electronic component within the third well region, wherein the third component is part of a second control circuit coupled to the second control electrode; and
a fourth electronic component within the second well region, wherein the fourth component is another part of the second control circuit coupled to the second control electrode.

12. An electronic device including an integrated circuit comprising:
a buried conductive region;
a semiconductor layer overlying the buried conductive region, wherein the semiconductor layer has a primary surface and an opposing surface, and the buried conductive region lies closer to the opposing surface than to the primary surface; and
a first well region including a first doped structure and a first interior portion, wherein:
the first doped structure defines the first interior portion of the semiconductor layer
the first doped structure and the first interior portion have a same conductivity type;
the first doped structure has a higher dopant concentration as compared to the first interior portion; and
the first well region is spaced apart from the buried conductive region by a portion of the semiconductor layer; and
a second well region that includes a second doped structure that defines a second interior portion of the semiconductor layer.

13. The electronic device of claim 12, wherein the second doped structure lies between the buried conductive region and the second interior portion.

14. The electronic device of claim 13, further comprising a third doped structure, wherein the third doped structure lies between the buried conductive region and the second well region.

15. The electronic device of claim 12, further comprising:
a third doped structure that defines a third interior portion of the semiconductor layer;
a third well region that includes a combination of the third doped structure and the third interior portion;
the third doped structure, the third interior portion, and the first well region have the first conductivity type; and
the third doped structure has a higher dopant concentration as compared to the third interior portion.

16. The electronic device of claim 15, wherein the first well region is a p-well region, the second well region is an n-well region, and the third well region is another p-well region.

* * * * *